(12) United States Patent
Aoshima

(10) Patent No.: US 12,345,876 B2
(45) Date of Patent: Jul. 1, 2025

(54) MICROMIRROR DEVICE

(71) Applicant: FUJIFILM Corporation, Tokyo (JP)

(72) Inventor: Keisuke Aoshima, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 470 days.

(21) Appl. No.: 18/048,659

(22) Filed: Oct. 21, 2022

(65) Prior Publication Data
US 2023/0084499 A1 Mar. 16, 2023

Related U.S. Application Data

(63) Continuation of application No. PCT/JP2021/015447, filed on Apr. 14, 2021.

(30) Foreign Application Priority Data

Apr. 23, 2020 (JP) .................... 2020-076928

(51) Int. Cl.
G02B 26/08 (2006.01)
B81B 3/00 (2006.01)
G02B 5/08 (2006.01)

(52) U.S. Cl.
CPC ........ *G02B 26/0858* (2013.01); *B81B 3/0018* (2013.01); *G02B 5/0808* (2013.01); *B81B 2201/042* (2013.01)

(58) Field of Classification Search
CPC ............ G02B 26/0833; G02B 26/0858; G02B 26/085; G02B 26/0841; G02B 26/105; G02B 26/101

See application file for complete search history.

(56) References Cited

U.S. PATENT DOCUMENTS 12,019,235 B2 * 6/2024 Naono ................. G02B 26/101
2015/0277107 A1 10/2015 Aimono
(Continued)

FOREIGN PATENT DOCUMENTS

| JP | 2013-114015 A | 6/2013 |
| JP | 2015-184590 A | 10/2015 |
| JP | 2017-132281 A | 8/2017 |

OTHER PUBLICATIONS

Extended European Search Report for corresponding European Application No. 21792797.9, dated Sep. 12, 2023.
(Continued)

*Primary Examiner* — Christopher Stanford
(74) *Attorney, Agent, or Firm* — Birch, Stewart, Kolasch & Birch, LLP

(57) ABSTRACT

The micromirror device includes a mirror part, a first actuator that reciprocally rotates the mirror part about the first axis, and a second actuator that reciprocally rotates the mirror part about the second axis. A resonance frequency A in a lowest-order resonance mode as a resonance mode in which the mirror part and the first actuator are rotated about the first axis in opposite phases to each other, a resonance frequency B in a lowest-order resonance mode as a resonance mode in which the mirror part and the first actuator oscillate in opposite phases in a direction orthogonal to both of the first axis and the second axis, a frequency difference F=A−B, a resonance frequency C less than F and closest to the F, and a resonance frequency D greater than F and closest to F satisfy F−C≥20 Hz and F−D≤−150 Hz.

7 Claims, 12 Drawing Sheets

(56) References Cited

U.S. PATENT DOCUMENTS

| | | |
|---|---|---|
| 2017/0210278 A1 | 7/2017 | Matsuno |
| 2019/0265462 A1 | 8/2019 | Yamada |
| 2020/0057298 A1 | 2/2020 | Boni et al. |
| 2021/0405350 A1* | 12/2021 | Naono ................. H10N 30/853 |

OTHER PUBLICATIONS

International Preliminary Report on Patentability and Written Opinion of the International Searching Authority (Forms PCT/IB/326, PCT/IB/373, and PCT/ISA/237) for International Application No. PCT/JP2021/015447, dated Nov. 3, 2022, with an English translation.

International Search Report (Form PCT/ISA/210) for International Application No. PCT/JP2021/015447, dated Jul. 6, 2021, with an English translation.

* cited by examiner

MICROMIRROR DEVICE

CROSS-REFERENCE TO RELATED APPLICATIONS

This application is a continuation application of International Application No. PCT/JP2021/015447, filed Apr. 14, 2021, the disclosure of which is incorporated herein by reference in its entirety. Further, this application claims priority from Japanese Patent Application No. 2020-076928, filed Apr. 23, 2020, the disclosure of which is incorporated herein by reference in its entirety.

BACKGROUND OF THE INVENTION

1. Field of the Invention

The present disclosure relates to a micromirror device.

2. Description of the Related Art

A micromirror device is known as one of the micro electro mechanical systems (MEMS) devices manufactured by using the microfabrication technology of silicon (Si). Since this micromirror device has a small size and has low power consumption, it is expected to have a wide range of applications including laser displays such as a head-up display and a retinal display using a laser, scanners for optical diagnosis such as an optical interference tomography measurement system, and the like. The micromirror device is also referred to as a MEMS scanner or the like since a scanner that performs optical scanning by displacement of a mirror part, such as a laser display or a scanner for optical diagnosis, is mainly used.

There are various driving methods for the micromirror device. However, the piezoelectric driving method that utilizes the deformation of the piezoelectric element has a higher torque density defined by the magnitude of the generated torque per unit mass of the actuator than the other methods. Therefore, the piezoelectric driving method has an advantage that the device has a small size and a relatively large displacement angle can be obtained as a displacement angle of the mirror part. Thus, the method is useful for an application requiring a large displacement angle. In particular, in the application requiring a large displacement angle, such as a laser display, resonance driving that resonates a mirror part is mainly used. In a case where the resonance driving is adopted, there is a great advantage in the magnitude of the torque of the piezoelectric driving method.

A general configuration of a micromirror device applied to a laser display includes: a mirror part that is rotatable about two axes including a first axis and a second axis orthogonal to each other; and a piezoelectric driving type actuator that reciprocally rotates the mirror part about each of two axes including the first axis and the second axis in accordance with a piezoelectric body driving voltage (refer to JP2017-132281A).

Resolution is one of the performance indexes of the laser display, and the driving frequency and the displacement angle of the mirror part in the micromirror device have a great effect on the resolution. For example, in a general raster scanning type laser display, two-dimensional optical scanning is performed by reciprocally rotating the mirror part of the micromirror device about the first axis and about the second axis at two different driving frequencies. In a case of performing the two-dimensional optical scanning, it is common to set the high speed side to 10 kHz or greater and the low-speed side to 10 to 100 Hz among the two types of driving frequencies. The larger the driving frequency and the displacement angle basically in rotation on the high speed side, the higher the resolution of the laser display. From the above-mentioned viewpoint, in many cases, the driving frequency on the high speed side is set to a resonance frequency of 10 kHz or greater, and the mirror part is driven at a large displacement angle by the resonance driving.

In the micromirror device as described above, in a case where the mirror part is driven in a driving mode of a specific resonance frequency, unnecessary resonance may occur at a frequency different from the resonance frequency in the driving mode, and normal optical scanning may be hindered by abnormal oscillation accompanying the unnecessary resonance. Hereinafter, the resonance mode, in which the above-mentioned unnecessary resonance occurs, is referred to as an abnormal oscillation mode.

In JP2013-114015A, it has been reported that the abnormal oscillation mode is oscillated in a case where a difference frequency between a frequency n times the resonance frequency (n is a natural number) in the driving mode and the resonance frequency in the abnormal oscillation mode is small. JP2013-114015A proposed a method of setting a difference frequency of 500 Hz or greater as a guideline for suppressing abnormal oscillation and adding a structure, which restricts displacement in the abnormal oscillation mode, to the structure of the micromirror device by using a technique of suppressing abnormal oscillation.

SUMMARY OF THE INVENTION

However, addition of an extra structure to the structure reduces manufacturing stability due to complexity of the structure. In addition, the eigenfrequency is reduced due to the increase in mass of the micromirror device. Therefore, the resonance frequency in the driving mode is significantly reduced. A decrease in resonance frequency in the driving mode leads to a decrease in displacement angle of the mirror part, which is not preferable.

Further, according to a study by the present inventor, in a micromirror device having a shape different from that described in JP2013-114015A, even in a case where a difference frequency between the frequency n times the resonance frequency (where n is a natural number) in the driving mode and the resonance frequency in the abnormal oscillation mode is separated by 500 Hz or greater, oscillation in the abnormal oscillation mode may occur.

The present inventor of the present invention has studied a micromirror device including: a first actuator that has first piezoelectric elements disposed in an annular shape around the mirror part, the first actuator being connected to the mirror part and reciprocally rotating the mirror part about the first axis by periodically deforming the first piezoelectric elements; and a second actuator that has second piezoelectric elements, the second actuator reciprocally rotating the mirror part about the second axis intersecting with the first axis by periodically deforming the second piezoelectric elements.

The present disclosure has been made in view of the above-mentioned circumstances, and an object of the present disclosure is to provide a micromirror device capable of suppressing abnormal oscillation in the micromirror device having the above-mentioned structure.

Specific means for solving the above-mentioned problems includes the following aspects.

<1>

According to an aspect of the present invention, there is provided a micromirror device that has a mirror part having a reflecting surface which reflects incident light and that changes two-dimensionally an orientation of the reflecting surface by reciprocally rotating the mirror part about two axes of a first axis and a second axis intersecting each other, the micromirror device comprising:

a first actuator that has first piezoelectric elements disposed in an annular shape around the mirror part, the first actuator being connected to the mirror part and reciprocally rotating the mirror part about the first axis by periodically deforming the first piezoelectric elements; and a second actuator that has second piezoelectric elements, the second actuator reciprocally rotating the mirror part about the second axis by periodically deforming the second piezoelectric elements, in which assuming that a resonance frequency in a lowest-order resonance mode as a resonance mode, in which the mirror part and the first actuator reciprocally rotate about the first axis in opposite phases with each other, among a plurality of resonance modes having different resonance frequencies is A, a resonance frequency in a lowest-order resonance mode as a resonance mode, in which the mirror part and the first actuator oscillate in opposite phases in a direction orthogonal to both the first axis and the second axis, among the plurality of resonance modes, is B, a difference A-B between the resonance frequency A and the resonance frequency B is a frequency difference F, a resonance frequency in a resonance mode having a resonance frequency of a frequency less than the frequency difference F as a resonance mode having a resonance frequency closest to the frequency difference F among the plurality of resonance modes is C, and a resonance frequency in a resonance mode having a resonance frequency of a frequency greater than the frequency difference F as a resonance mode having a resonance frequency closest to the frequency difference F among the plurality of resonance modes is D, a difference $\Delta F1$ between the frequency difference F and the resonance frequency C satisfies $\Delta F1 = F - C \geq 20 Hz$, and a difference $\Delta F2$ between the frequency difference F and the resonance frequency D satisfies $\Delta F2 = F - D \leq -150 Hz$.

<2>

The micromirror device according to <1>, in which the difference $\Delta F1$ and the difference $\Delta F2$ satisfy $\Delta F1 \geq 100 Hz$, and $\Delta F2 \leq -400 Hz$.

<3>

The micromirror device according to <1> or <2>, in which the mirror part and the first actuator are connected through a first connecting part extending along the first axis.

<4>

The micromirror device according to any one of <1> to <3>, further comprising:

a movable frame that has an annular shape to surround the first actuator; and a second connecting part that connects the movable frame and the first actuator, in which the second actuator reciprocally rotates the mirror part about the second axis through the movable frame.

<5>

The micromirror device according to <4>, in which the second connecting part extends along the first axis.

<6>

The micromirror device according to any one of <1> to <5>, in which the second actuator includes two or greater rectangular plate-like parts, and includes a meander structure in which the two or greater rectangular plate-like parts are folded back in a meander shape with a coupling part interposed therebetween, and each of the two or greater rectangular plate-like parts includes the second piezoelectric element.

<7>

The micromirror device according to any one of <1> to <6>, in which the resonance frequency A is equal to or greater than 10 kHz.

According to the present disclosure, it is possible to provide a micromirror device capable of suppressing abnormal oscillation.

BRIEF DESCRIPTION OF THE DRAWINGS

FIG. 6A shows scanning lines during abnormal oscillation and FIG. 6B shows scanning lines during normal operation.

DESCRIPTION OF THE PREFERRED EMBODIMENTS

Hereinafter, specific embodiments of the present disclosure will be described, with reference to the drawings.

Figure 1:
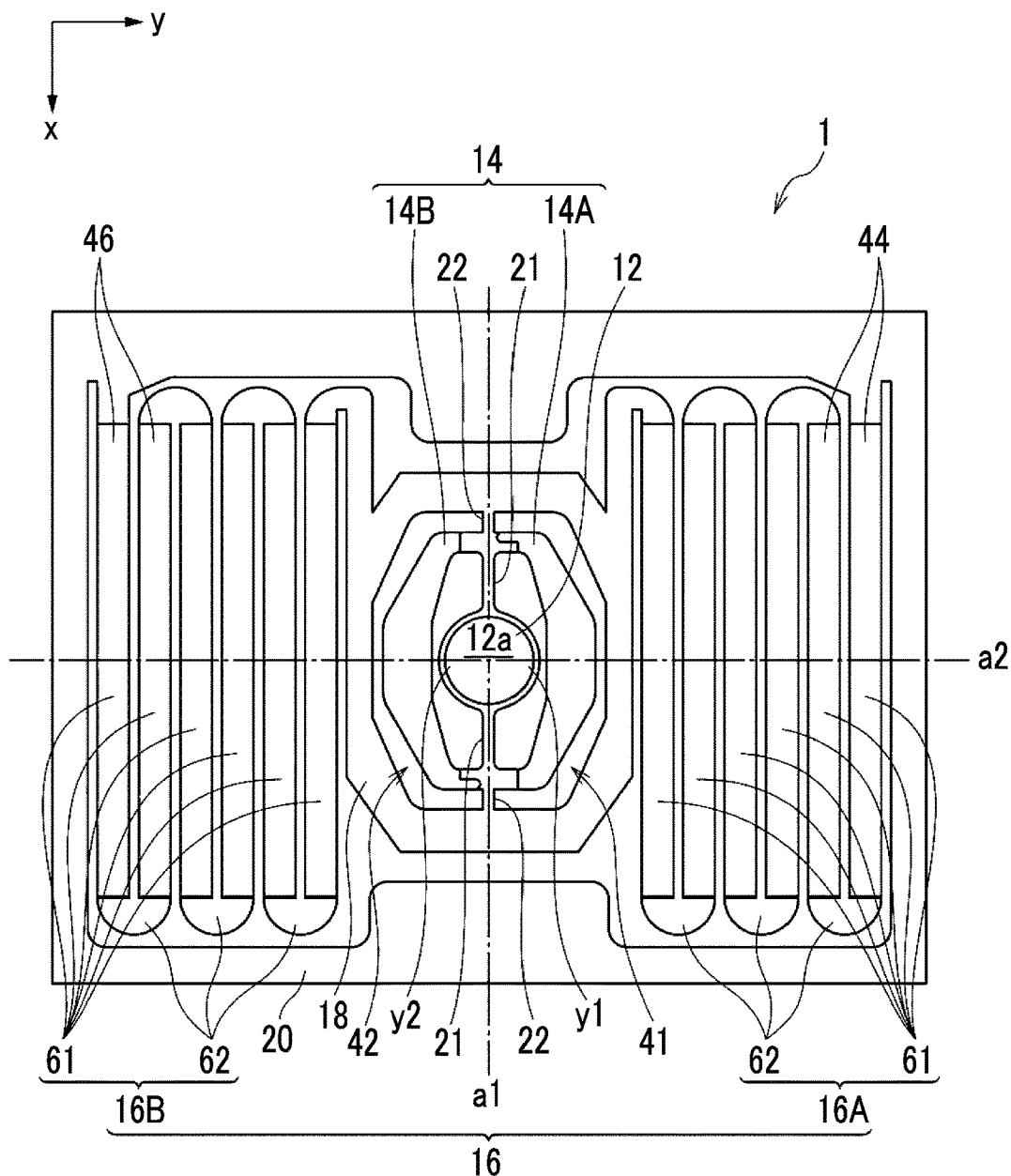
FIG. 1 is a plan view of a micromirror device of an embodiment.
Figure 2:
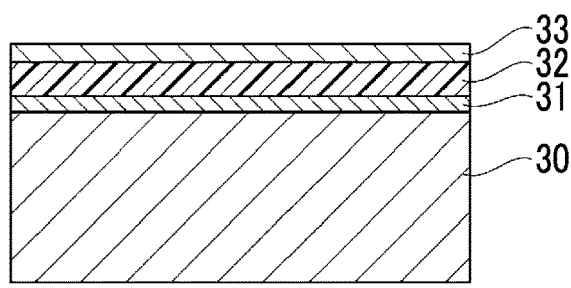
FIG. 2 is a diagram showing a cross-sectional structure of a part of the micromirror device.
Figure 3:
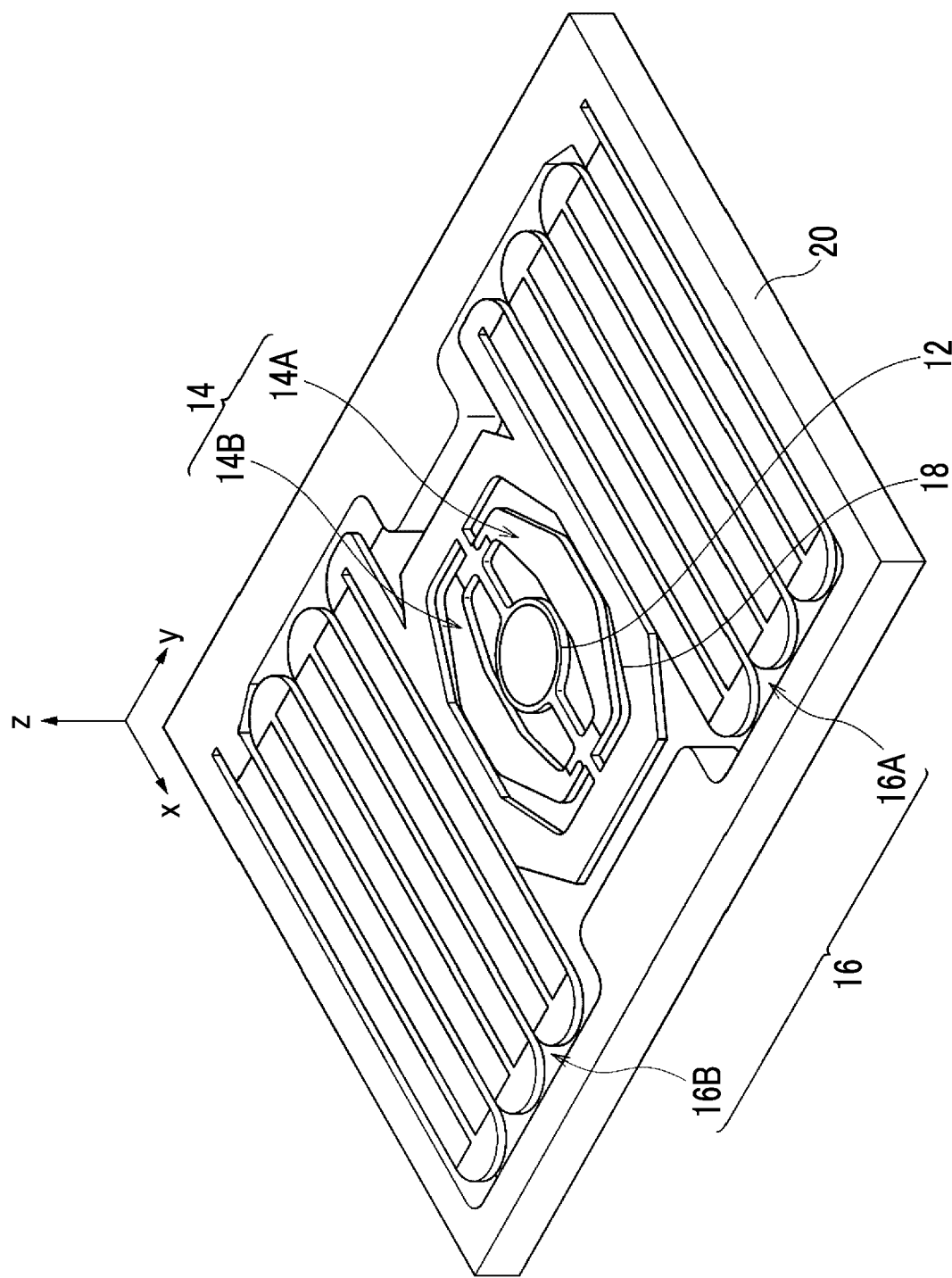
FIG. 3 is a perspective view of a structure of the micromirror device of the embodiment as viewed from an upper surface side.
Figure 4:
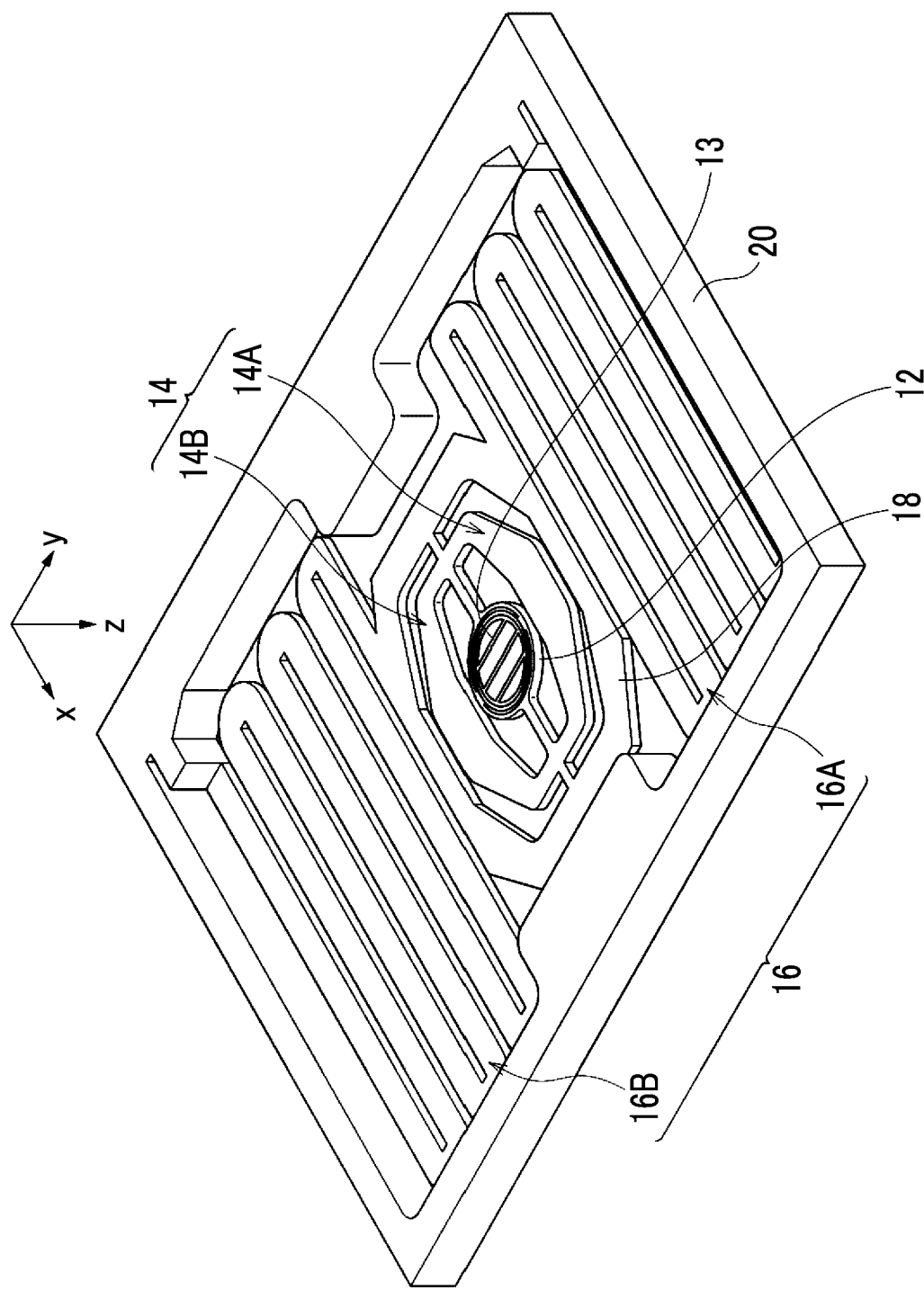
FIG. 4 is a perspective view of the structure of the micromirror device of the embodiment as viewed from a bottom surface side.

FIG. 1 is a plan view of a micromirror device 1 according to an embodiment. FIG. 2 is a diagram showing a cross-sectional structure of a part of the micromirror device 1. FIG. 3 is a perspective view of the micromirror device 1 as viewed from an upper surface side. FIG. 4 is a perspective view of the micromirror device 1 as viewed from a bottom surface side.

The micromirror device 1 of the present embodiment includes a mirror part 12, a first actuator 14, a first connecting part 21, a movable frame 18, a second connecting part 22, a fixing unit 20, and a second actuator 16. The first actuator 14 is disposed in an annular shape around the mirror part 12 and includes the first piezoelectric elements 41 and 42. The first connecting part 21 connects the mirror part 12 and the first actuator 14. The movable frame 18 is disposed in an annular shape around the first actuator 14. The second connecting part 22 connects the first actuator 14 and the movable frame 18. The fixing unit 20 is disposed on the outer circumference of the movable frame 18. The second actuator 16 has second piezoelectric elements 44 and 46 and is disposed between the movable frame 18 and the fixing unit 20. In the present example, the second actuator 16 is connected to the first actuator 14 through the movable frame 18 and the second connecting part 22, and reciprocally rotates the mirror part 12 and the first actuator 14 about the second axis through the movable frame 18.

The first actuator 14 comprises a pair of semi-annular actuator parts 14A and 14B, each comprising first piezoelectric elements 41 and 42. Further, the second actuator 16 comprises a pair of meander type actuator parts 16A and 16B, and each of the second actuator 16 comprises second piezoelectric elements 44 and 46. The first piezoelectric elements 41 and 42 and the second piezoelectric elements 44 and 46 have a laminated structure in which a lower electrode 31, a piezoelectric film 32, and an upper electrode 33 are laminated in this order on the oscillation plate 30 (refer to FIG. 2). In addition, in FIG. 2, for easy visual recognition, a film thickness of each layer and a ratio of the film thicknesses are shown with dimensions different from actual dimensions. In the drawing of FIG. 2, the upper electrode 33 and the lower electrode 31 are disposed to face each other with the piezoelectric film 32 interposed therebetween and are respectively disposed above and below the piezoelectric film 32. Thus, for convenience of explanation, the expressions "upper" and "lower" are used. However, the "upper" and "lower" of the upper electrode 33 and the lower electrode 31 do not necessarily mean the upper part and the lower part in the actual arrangement. For example, in the actual arrangement, the upper electrode 33 may be located below the lower electrode 31 in the vertical direction. Further, in the actual arrangement, the upper electrode 33 and the lower electrode 31 may be disposed to face each other in the horizontal direction. As described above, the upper part and the lower part are names for convenience. In the present embodiment, in the pair of electrodes with the piezoelectric film 32 interposed therebetween, the electrode provided on the oscillation plate 30 side is referred to as the lower electrode 31, and the electrode disposed to face the lower electrode 31 with the piezoelectric film 32 interposed therebetween is referred to as the upper electrode 33.

The meander type actuator part 16A has a plurality of rectangular plate-like parts 61 each comprising the second piezoelectric element 44, and a coupling part 62 that connects the adjacent rectangular plate-like parts 61. In the present example, the number of rectangular plate-like parts 61 is six. The six rectangular plate-like parts 61 are disposed side by side in a posture in which the sides in the longitudinal direction are parallel to each other, and one end portion is connected through the coupling part 62. In a case where the six rectangular plate-like parts 61 are viewed as a whole, it appears that the six rectangular plate-like parts 61 are folded back through the coupling part 62. Such a shape is called a meander shape since the shape looks as if the river is meandering, and a meander-like structure is called a meander structure. As described above, the meander type actuator part 16A includes a meander structure in which six rectangular plate-like parts 61 are folded back in a meander shape through the coupling part 62 as a whole. The meander type actuator part 16B has a plurality of rectangular plate-like parts 61 each comprising a second piezoelectric element 46 and the coupling part 62, and has substantially the same structure as the meander type actuator part 16A.

In the first actuator 14 and the second actuator 16, the piezoelectric film 32 is deformed in a case where a predetermined voltage is applied to each of the piezoelectric elements 41 and 42, 44, and 46. In a case where the piezoelectric film 32 is deformed, the first actuator 14 and the second actuator 16 are flexed and displaced to generate driving force. That is, in the first actuator 14, the mirror part 12 is reciprocally rotated about the first axis a1 by periodically deforming each of the first piezoelectric elements 41 and 42. Further, the second actuator 16 causes the mirror part 12 to reciprocally rotate about the second axis a2 by periodically deforming each of the second piezoelectric elements 44 and 46.

Each size of the micromirror device 1 is generally, for example, about 1 mm to 10 mm in length and width, but may be smaller or greater than the above-mentioned size, and is not particularly limited. Further, the thickness of the movable part is generally about 5 μm to 0.2 mm, but may be within a range in which the actuator can be manufactured, and is not particularly limited.

The first actuator 14 applies a rotational torque to the mirror part 12 about the first axis a1, and the second actuator 16 applies a rotational torque to the first actuator 14 about the second axis a2 orthogonal to the first axis a1. Thereby, the mirror part 12 is driven to rotate two-dimensionally about the first axis a1 and the second axis a2. By driving the mirror part 12 in two-dimensional rotation, the micromirror device 1 reflects the incident light on the reflecting surface 12a of the mirror part 12. Thereby, it is possible to perform two-dimensional scanning.

The first axis a1 is in a plane including the reflecting surface 12a of the mirror part 12 in a case where the reflecting surface 12a is stationary. The second axis a2 intersects with the first axis a1 in this plane. In the present example, the first axis a1 and the second axis a2 are axes orthogonal to each other. It should be noted that the first axis a1 and the second axis a2 preferably intersect at the center of the reflecting surface 12a, but the position of the intersection may be deviated from the center.

Hereinafter, in each drawing, the normal direction of the reflecting surface 12a in a case where the mirror part 12 is stationary, that is, the direction orthogonal to the first axis a1 and the second axis a2 is the z axis direction, the direction parallel to the first axis a1 is the x axis direction, and the direction parallel to the second axis a2 is the y axis direction.

This micromirror device 1 drives the mirror part 12 about the first axis a1 with a driving frequency on the high speed side and about the second axis a2 with a driving frequency on the low speed side. The first actuator 14 is connected to the mirror part 12 through the first connecting part 21 extending along the first axis a1. Since the first connecting part 21 has an elongated shape extending along the first axis a1, the moment of inertia about the first axis a1 is relatively small. Such a structure in which the rotational torque is transferred to the mirror part 12 through the first connecting part 21 is suitable for high-speed driving of the mirror part 12 about the first axis a1. It is preferable that the driving frequency about the first axis a1 is equal to or greater than 10 kHz. In a case where the micromirror device 1 is applied to a laser display, high-definition image display is possible by setting a driving frequency of 10 kHz or greater for reciprocally rotating the mirror part 12 about the first axis a1. The meander type actuator parts 16A and 16B of the second actuator 16 function as long leaf springs that connect the first actuator 14 and the fixing unit 20. Therefore, the second actuator 16 has higher flexibility while lowering the responsiveness, and is suitable for driving the first actuator 14 and the mirror part 12 about the second axis a2 at a low speed. As described above, it is preferable to use a resonance frequency for driving about the first axis a1.

The micromirror device 1 has a plurality of resonance modes having different resonance frequencies corresponding to a plurality of natural frequencies. For the driving about the first axis a1, among the plurality of resonance modes, it is preferable to use a resonance mode in which the mirror part 12 and the first actuator 14 are reciprocally rotated about the first axis a1 in opposite phases and which is a lowest-order resonance mode since the driving efficiency is high. Hereinafter, a mode, in which the mirror part 12 and the first actuator 14 are reciprocally rotated about the first axis a1 in opposite phases and which is the lowest-order resonance mode, is referred to as a driving mode. By driving the mirror part 12 in the driving mode, a large displacement angle can be realized with a lower driving voltage. The lowest-order means that the frequency is the lowest.

The plurality of resonance modes of this micromirror device 1 satisfy the following relationship.

A resonance frequency in the driving mode about the first axis a1 is assumed as A. Further, a resonance frequency in the lowest-order resonance mode as a resonance mode, in which the mirror part 12 and the first actuator 14 oscillate in opposite phases in a direction (z axis direction) orthogonal to both the first axis a1 and the second axis a2, is assumed as B. Then, a difference A-B between the resonance frequency A and the resonance frequency B is assumed as a frequency difference F. Further, a resonance frequency in a resonance mode having a resonance frequency of a frequency less than the frequency difference F as a resonance mode having a resonance frequency closest to the frequency difference F among the plurality of resonance modes is assumed as C. A resonance frequency in a resonance mode having a resonance frequency of a frequency greater than the frequency difference F as a resonance mode having a resonance frequency closest to the frequency difference F among the plurality of resonance modes is assumed as D.

In such a case, a difference $\Delta F1$ between the frequency difference F and the resonance frequency C satisfies $$\Delta F1 = F - C \geq 20 Hz,$$

and
a difference $\Delta F2$ between the frequency difference F and the resonance frequency D satisfies $$\Delta F2 = F - D \leq -150 Hz.$$

In other words, in this micromirror device 1, the resonance mode of the micromirror device 1 is not present in the frequency range of greater than F−20 Hz and less than F+150 Hz.

Further, it is preferable that $\Delta F1 \geq 100$ Hz and $\Delta F2 \leq -400$ Hz. That is, it is preferable that the resonance mode of the micromirror device 1 is not present in the frequency range of greater than F−100 Hz and less than F+400 Hz.

In the micromirror device 1 having the present configuration, the resonance frequency A is greater than the resonance frequency B.

According to the study of the present inventor, by satisfying the above-mentioned relational expression in the resonance mode of the micromirror device 1, in a case where the mirror part 12 is driven in the driving mode, it is possible to suppress occurrence of unnecessary resonance of a frequency different from the resonance frequency A in the driving mode.

In a micromirror device, in a case where unnecessary resonance occurs, oscillation accompanying the unnecessary resonance (hereinafter, referred to as abnormal oscillation) is superimposed on the reciprocating rotation of the mirror part 12, which is generated in the driving mode, about the first axis a1. Due to this abnormal oscillation, the scanning line is largely deviated in time with respect to the width direction and the length direction, which causes a problem that normal optical scanning is hindered. However, by satisfying $\Delta F1 = F - C \geq 20$ Hz and $\Delta F2 = F - D \leq -150$ Hz, occurrence of abnormal oscillation is suppressed, and the mirror part 12 can be reciprocally rotated at a sufficient displacement angle without causing blurring of the scanning line. Further, by further satisfying $\Delta F1 \geq 100$ Hz and $\Delta F2 \leq -400$ Hz, it is possible to suppress occurrence of abnormal oscillation up to a larger displacement angle. In a case where the micromirror device 1 of the present embodiment is applied to, for example, a laser display or the like, since abnormal oscillation is small, very high-definition image display can be realized.

According to the study of the present inventor, even in a micromirror device having a structure similar to that of the micromirror device 1, in a case where a plurality of resonance modes do not satisfy the above-mentioned relationship, it was clarified that abnormal oscillation occurs in a case where the mirror part 12 is driven about the first axis a1 and that the reciprocating rotation can not be performed at a sufficient displacement angle (refer to the test example to be described later).

Figure 5:
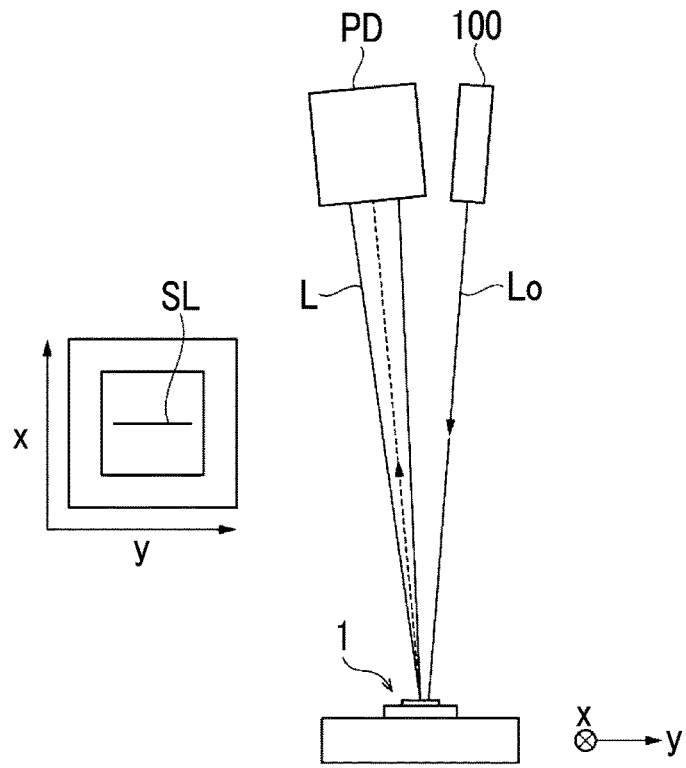
FIG. 5 is a diagram showing a method of detecting presence or absence of abnormal oscillation.

Presence or absence of occurrence of abnormal oscillation of the micromirror device 1 can be confirmed by observing the scanning lines. FIG. 5 is a diagram showing a method of detecting presence or absence of abnormal oscillation. Laser light Lo is incident on the mirror part of the micromirror device 1 from the light source 100 in a state in which the micromirror device 1 is provided on a horizontal plane and the mirror part 12 is driven to reciprocally rotate about the first axis a1. Laser light L reflected by the mirror part 12 is detected by the two-dimensional photodetector PD, and a scanning line SL of the laser light scanned in the y axis direction is observed.

Figure 6A:
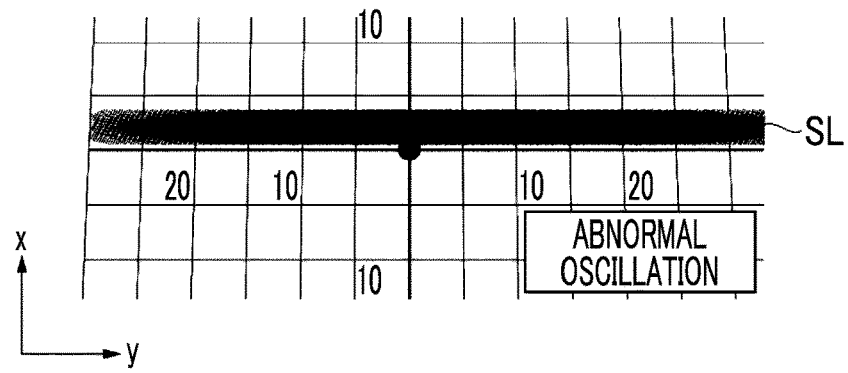
FIGS. 6A and 6B are diagrams showing scanning lines detected by a photodetector, where
Figure 6B:
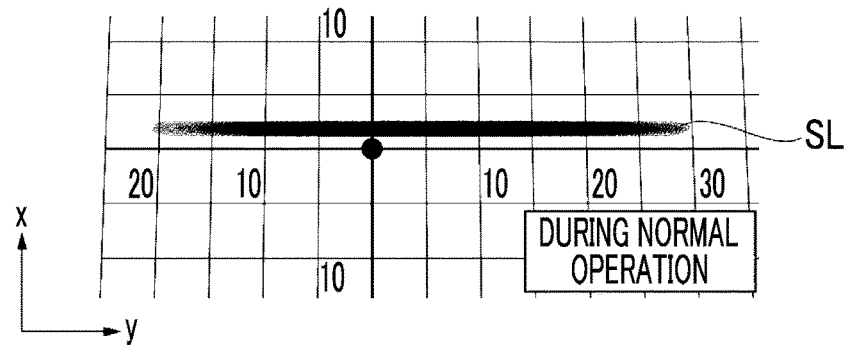

In FIGS. 6A and 6B, FIG. 6A shows the scanning line SL in a case where abnormal oscillation occurs, and FIG. 6B shows the scanning line SL in a normal state in which abnormal oscillation does not occur. As shown in FIGS. 6A and 6B, in the scanning line SL in a case where abnormal oscillation occurs, the width of the scanning line SL in the x axis direction is greater than that in a normal scanning line SL, and the length thereof is equal to or greater than the scanning amount in the y axis direction. In such a case where abnormal oscillation occurs, the scanning line SL is extremely blurred in both the x axis direction and the y axis direction. Therefore, it is possible to determine whether or not the scanning line SL is blurred on the basis of the width of the scanning line SL in the x axis direction and the length of the scanning line SL in the y axis direction, and it is possible to determine whether or not abnormal oscillation is present on the basis of whether or not the scanning line SL is blurred. That is, it is determined that abnormal oscillation occurs in the case where the scanning line is blurred, and that abnormal oscillation does not occur in the case where the scanning line is not blurred.

Here, a description will be given of an example of an unnecessary resonance mode that occurs in a case where abnormal oscillation occurs with respect to the micromirror device 1A (refer to FIG. 16) of a test example to be described later which has a shape similar to that of the micromirror device 1 of the above-mentioned embodiment.

Figure 7:
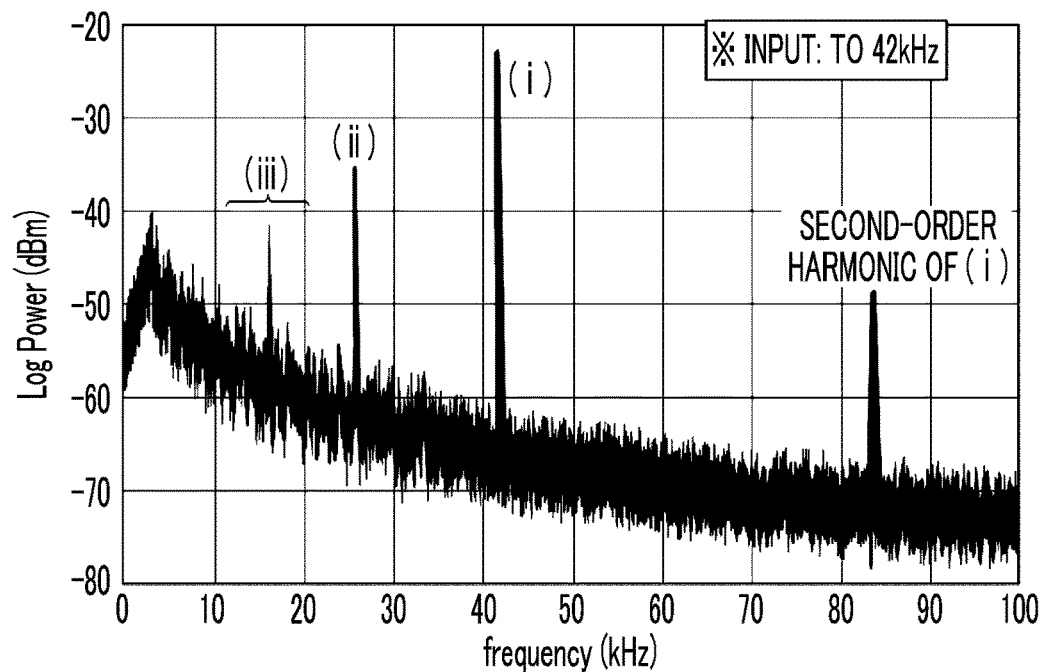
FIG. 7 is a frequency spectrum analysis diagram in a case where abnormal oscillation occurs during driving.

FIG. 7 relates to the micromirror device 1A (specifically, Test Example 9) in which abnormal oscillation occurs in a micromirror device 1A (refer to FIG. 16) of a test example to be described later in a state where the mirror part 12 is driven at a resonance frequency in a driving mode, and shows a frequency spectrum obtained by measuring a sensor signal in the micromirror device 1A and performing fast Fourier transform (FFT) analysis. Specifically, the frequency spectrum was obtained as follows. Regarding the micromirror device 1A, a driving signal of 42 kHz, which is the resonance frequency A in the driving mode (the first resonance mode (i) in the drawing) in which the mirror part 12 is reciprocally rotated about the first axis a1, is input to the first piezoelectric elements 41 and 42 of the first actuator 14. Further, oscillation occurring in the micromirror device 1A in a case where the mirror part 12 is driven at the resonance frequency A is acquired as a sensor signal by a piezoelectric sensor (not shown) incorporated in the micromirror device 1A, and the FFT analysis is performed.

From the frequency spectrum shown in FIG. 7, it is clear that another resonance mode occurs around about 26 kHz and about 16 kHz even though driving is performed in the driving mode near 42 kHz in the first resonance mode (i). Hereinafter, the resonance mode occurring at about 26 kHz is referred to as a second resonance mode (ii), and the resonance mode occurring at about 16 kHz is referred to as a third resonance mode (iii). In JP2013-114015A which is described as a prior art, it is stated that abnormal oscillation is excited in a case where the resonance mode is set in a range of 500 Hz from the resonance frequency in the driving mode and a frequency n times the resonance frequency.

However, in the micromirror device 1A, as shown in FIG. 7, the unnecessary resonance frequencies of the second resonance mode (ii) and the third resonance mode (iii) are excited even though the resonance frequencies are separated by 10 kHz or greater from both the resonance frequency in the first resonance mode (i) as the driving mode and the frequency of the second-order harmonic component in the first resonance mode. Thus, this situation does not satisfy the law of occurrence of abnormal oscillation described in JP2013-114015A.

Accurate resonance frequencies and oscillation shapes for the above-mentioned driving mode (first resonance mode (i)) and resonance modes (second resonance mode (ii) and third resonance mode (iii)) other than the second-order harmonic resonance mode were set as follows, and examination was performed thereon.

Regarding the micromirror device 1A of Test Example 9 in which the above-mentioned frequency spectrum of FIG. 7 is acquired, a chirp signal having a voltage amplitude of 2 V and an instantaneous frequency of 0 to 100 kHz was input to the first piezoelectric elements 41 and 42 of the first actuator 14, and displacements of the mirror part 12 and the first actuator 14 generated by the chirp signal due to oscillation were measured using a laser Doppler oscillation meter. A measurement method and a method for specifying the resonance mode will be described in detail in Test Examples described below. The resonance frequencies and oscillation shapes of the second resonance mode (ii) and the third resonance mode (iii) were identified from the displacements of the mirror part 12 and the first actuator 14 by the laser Doppler oscillation meter.

Further, regarding the micromirror device 1A of Test Example 9, a resonance mode analysis simulation was performed using a commercially available finite element method analysis software, and the resonance frequency and the oscillation shape of the resonance mode occurring in the range of 0 to 100 Hz were obtained.

From the comparison between the resonance frequency and the oscillation shape acquired by using the above-mentioned chirp signal and the resonance frequency and the oscillation shape of the resonance mode obtained by the simulation, the frequencies of the second resonance mode (ii) and the third resonance mode (iii) in FIG. 7 and the oscillation shapes of the resonance modes (that is, what kind of oscillation is accompanied by the resonance) were identified.

Since the resonance frequency acquired by using the chirp signal substantially coincides with the resonance frequency shown in the frequency spectrum of FIG. 7, it is possible to specify what oscillation shape each peak in FIG. 7 oscillates in the resonance mode. On the other hand, the acquired resonance frequency includes nth-order harmonic (n≥2) of the resonance mode. Thus, it is difficult to specify whether the resonance frequency is the resonance mode of the first-order harmonic or the resonance mode of the nth-order harmonic. On the other hand, although the resonance frequency in the resonance mode acquired by the simulation does not completely coincide with the resonance frequency obtained by the actual measurement of the device, the resonance frequency due to the nth-order harmonic can be excluded. Therefore, the resonance frequency that is not the nth-order harmonic of the micromirror device 1A and the oscillation shape thereof can be specified by comparing the resonance frequency acquired by using the chirp signal with the resonance frequency in the resonance mode acquired by the simulation.

Here, with reference to FIGS. 8 to 14, a description will be given of the oscillation shapes of the first resonance mode (i), which is the driving mode, and the second resonance mode (ii) and the third resonance mode (iii) obtained as described above. The third resonance mode (iii) in the frequency spectrum of FIG. 7 appears as one resonance mode corresponding to one resonance frequency, but actually includes a plurality of third resonance modes (iii)-1 to (iii)-5 shown in FIGS. 10 to 14. Each of the plurality of resonance modes (third resonance modes (iii)-1 to (iii)-5) shown in FIGS. 10 to 14 corresponds to different resonance frequencies. FIG. 8 to FIG. 14 are simulation diagrams showing the shapes of the maximum displacement states of respective resonance modes. In FIGS. 8 to 14, the amount of displacement is indicated by shading. In the drawing, 0 shown in the displacement scale indicates a position in a stationary state, and indicates that, in the stationary state, the darker the color (closer to black), the larger the displacement in the −z axis direction, and the lighter the color (closer to white), the larger the displacement in the +z axis direction.

Figure 8:
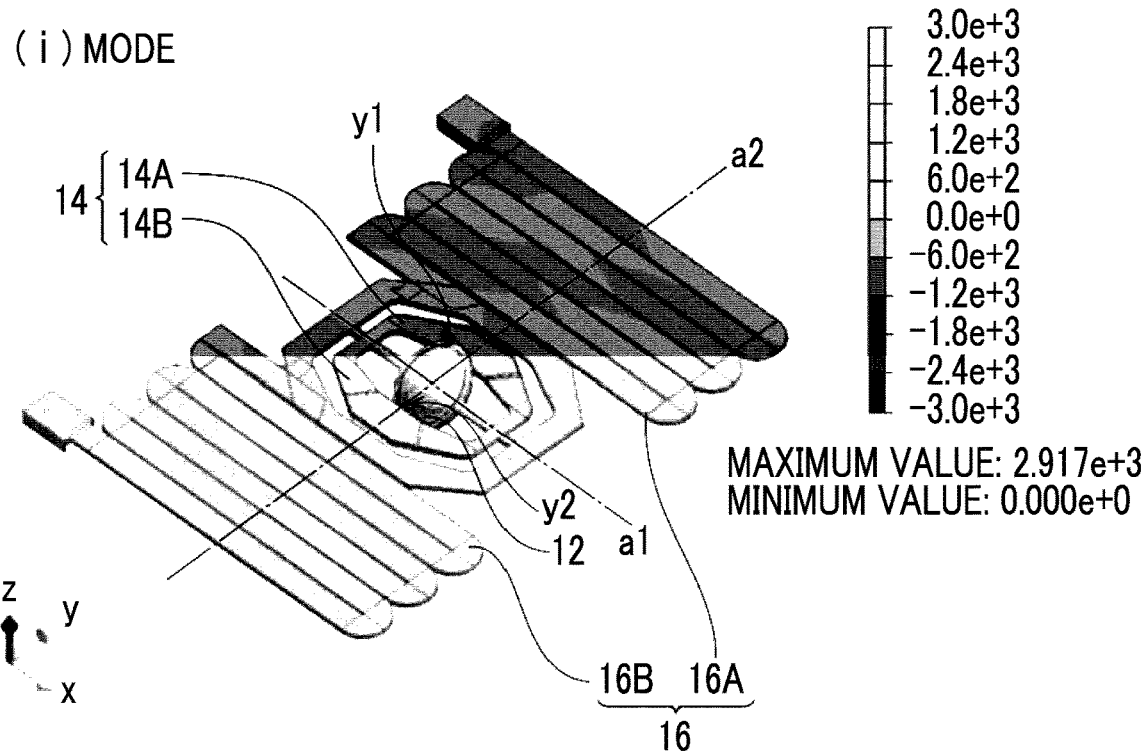
FIG. 8 is a simulation diagram of shape displacement of the micromirror device in a first resonance mode.

FIG. 8 is a simulation diagram showing a state at the time of maximum displacement in a case where the mirror part 12 and the first actuator 14 rotate about the first axis a1(x-axis) in opposite phases in a driving mode. FIG. 8 shows a state in which one end y1 of the mirror part 12 in the y axis direction is tilted and displaced in the +z axis direction and the other end y2 thereof in the y axis direction is tilted and displaced in the −z axis direction, with the first axis a1 set as a center. Further, although the amount of displacement is extremely small, in the first actuator 14, a part of the semi-annular actuator part 14A facing the one end y1 of the mirror part 12 is displaced in the −z axis direction, and a part of the semi-annular actuator part 14B facing the other end y2 of the mirror part 12 is displaced in the +z axis direction, with the first axis a1 set as a center.

Figure 9:
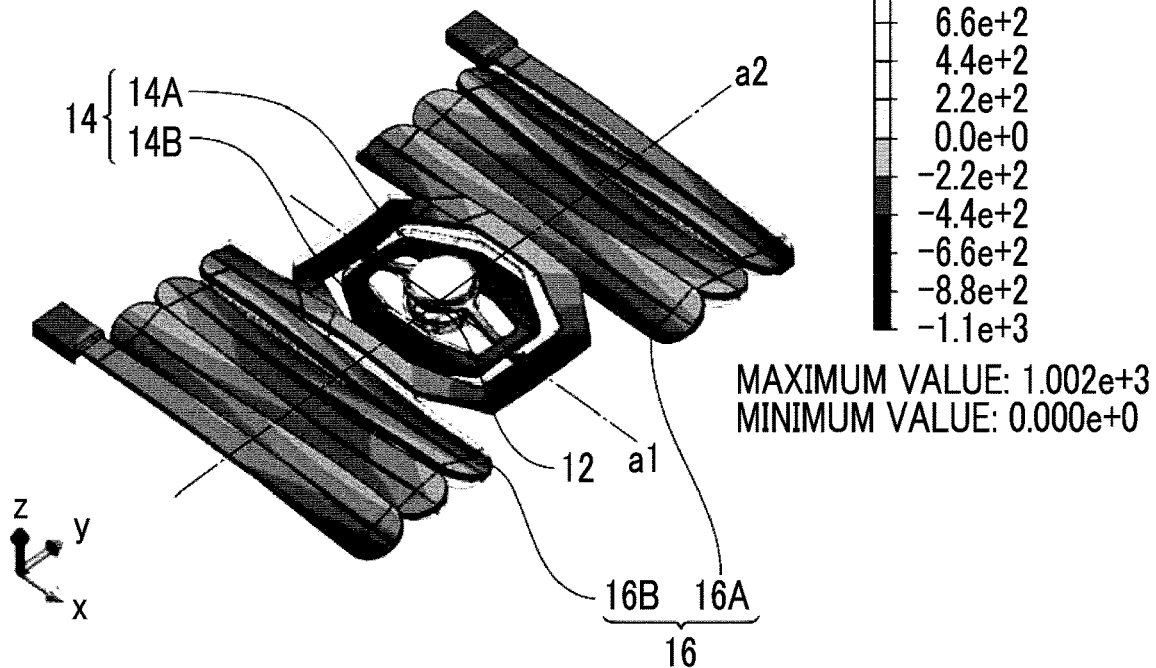
FIG. 9 is a simulation diagram of shape displacement of the micromirror device in a second resonance mode.

The second resonance mode (ii) is a resonance mode in which the mirror part 12 and the first actuator 14 rotate in opposite phases in the z axis direction orthogonal to a plane including the first axis a1(x-axis) and the second axis a2(y-axis). FIG. 9 is a simulation diagram in a case of the second resonance mode (ii). The second resonance mode (ii) is a oscillation mode in which the first actuator 14 is displaced in the −z axis direction in a case where the mirror part 12 is displaced in the +z axis direction as shown in FIG. 9.

Figure 10:
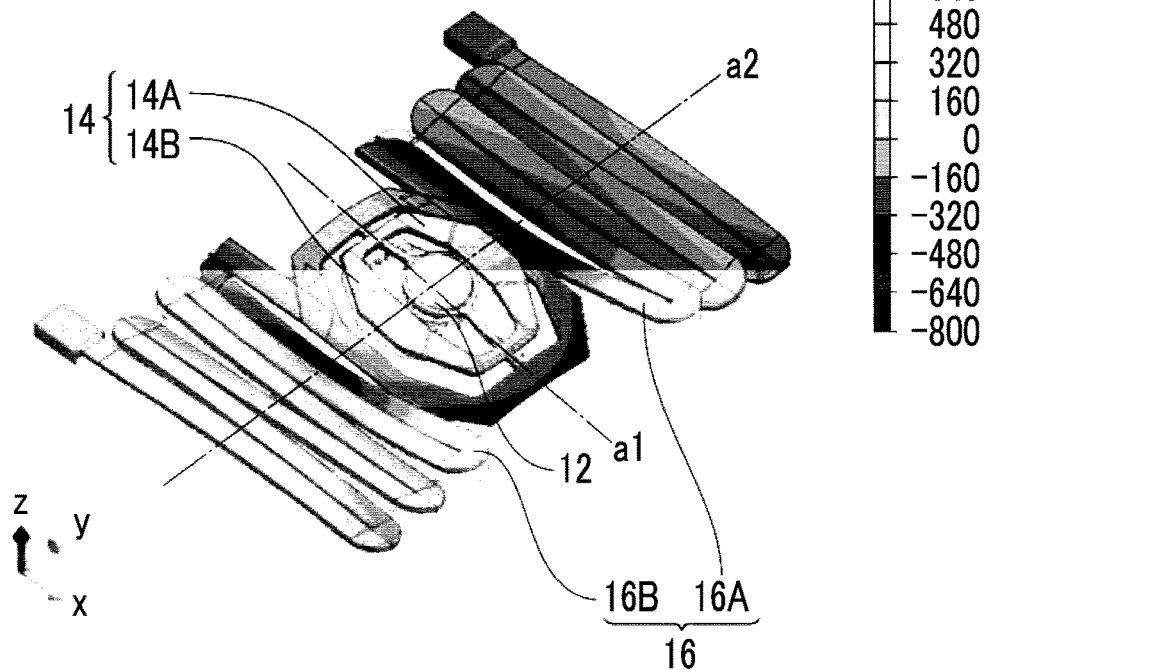
FIG. 10 is a simulation diagram of shape displacement in a resonance mode ((iii)-1 mode), which is one of a third resonance mode of the micromirror device.

The third resonance mode (iii)-1 shown in FIG. 10 is a mode in which the mirror part 12 and the first actuator 14 rotate in the same phase about the second axis a2.

Figure 11:
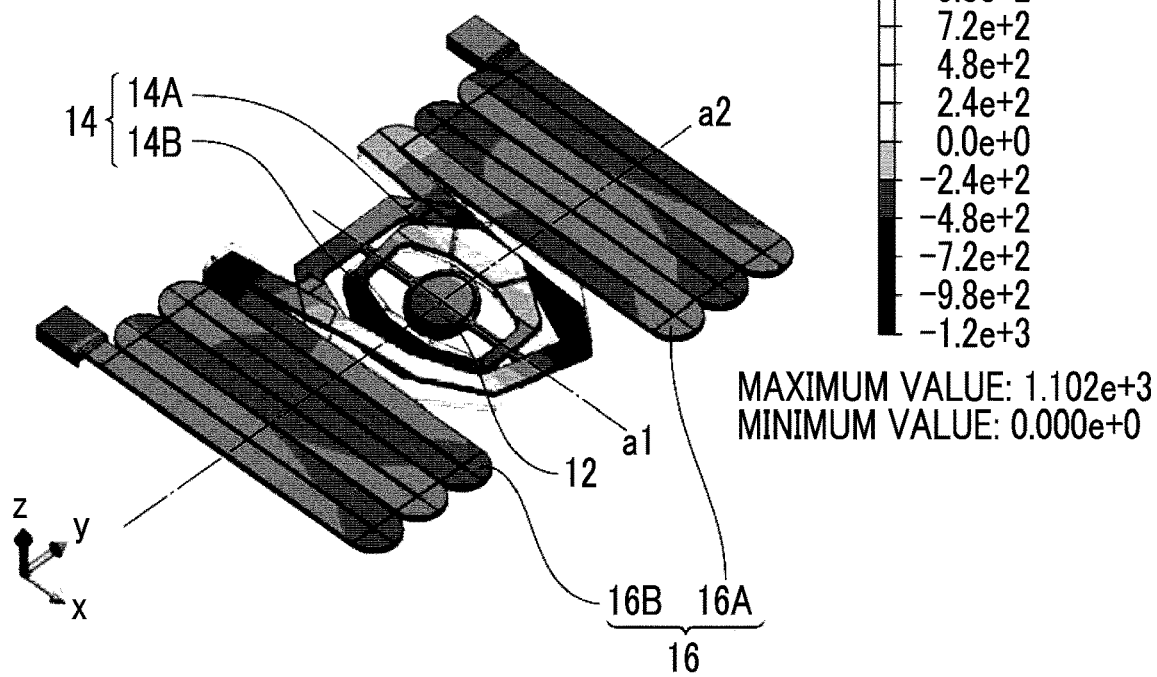
FIG. 11 is a simulation diagram of shape displacement in a resonance mode ((iii)-2 mode), which is one of the third resonance mode of the micromirror device.

The third resonance mode (iii)-2 shown in FIG. 11 is a mode in which the mirror part 12 and the first actuator 14 rotate in the same phase about the first axis a1.

Figure 12:
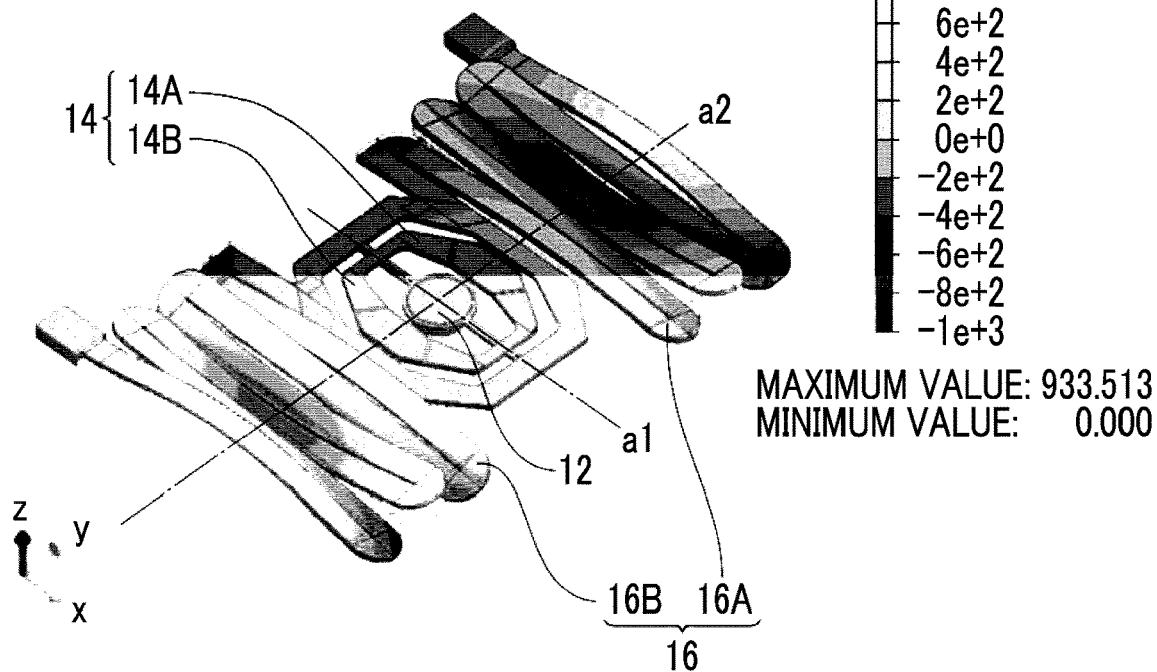
FIG. 12 is a simulation diagram of shape displacement in a resonance mode ((iii)-3 mode), which is one of the third resonance mode of the micromirror device.

The third resonance mode (iii)-3 shown in FIG. 12 is a mode in which the mirror part 12 and the first actuator 14 are hardly displaced, and the rectangular plate-like parts 61 of the pair of meander type actuator parts 16A and 16B of the second actuator 16 is distorted in the z axis direction with respect to the first actuator 14. In the third resonance mode (iii)-3 shown in FIG. 12, the pair of meander type actuator parts 16A and 16B are displaced in the same phase. Here, the term "same phase" refers to a state in which displacements occur in the same orientation of the z axis direction between the rectangular plate-like parts 61, which are disposed at symmetrical positions with the first axis a1 set as the axis of symmetry, among the plurality of rectangular plate-like parts 61 included in each of the meander type actuator parts 16A and 16B. For example, in FIG. 12, in the pair of meander type actuator parts 16A and 16B, the central portions of the rectangular plate-like parts 61 disposed at the farthest positions in the y axis direction from the first axis a1 are displaced so as to swell in the same orientation of the z axis direction. Further, in the third resonance mode (iii)-3 shown in FIG. 12, as the rectangular plate-like parts 61 of each of the pair of meander type actuator parts 16A and 16B are closer to the mirror part 12, the amount of distortion in the z axis direction is smaller. In addition, as the rectangular plate-like parts 61 are more separated from the mirror part 12 in the y axis direction, the amount of distortion in the z axis direction is greater.

Figure 13:
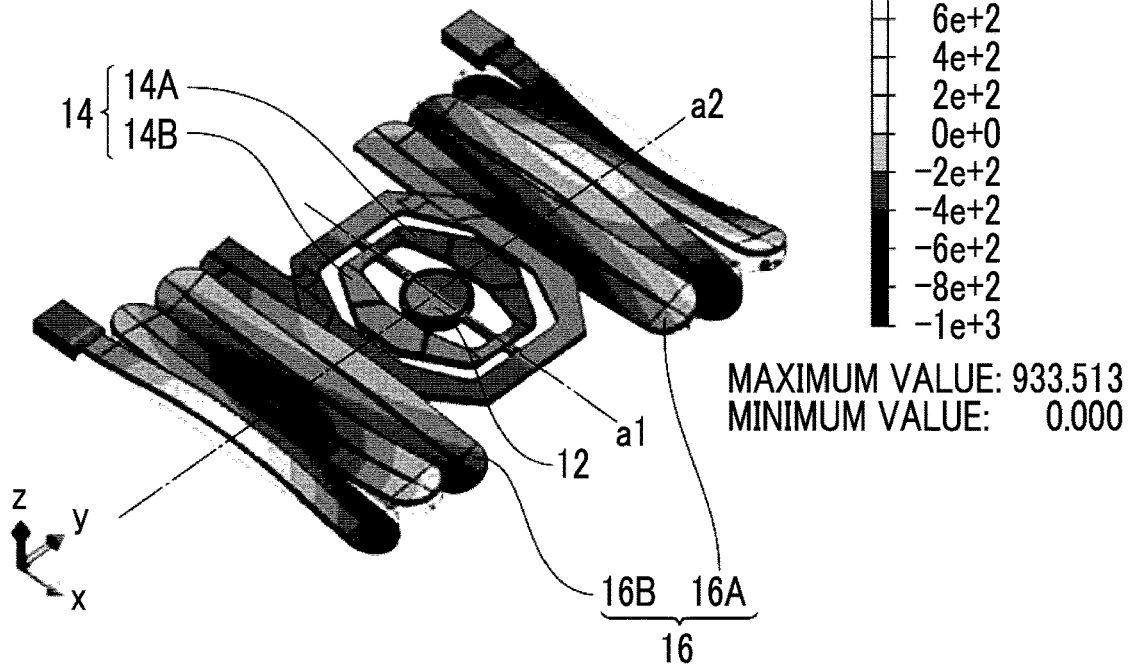
FIG. 13 is a simulation diagram of shape displacement in a resonance mode ((iii)-4 mode), which is one of the third resonance mode of the micromirror device.

The third resonance mode (iii)-4 shown in FIG. 13 is a mode in which the mirror part 12 and the first actuator 14 are hardly displaced, and the rectangular plate-like parts of the pair of meander type actuator parts 16A and 16B of the second actuator 16 are distorted in the z axis direction with the second axis a2 set as a center. Further, similarly to the third resonance mode (iii)-3 shown in FIG. 12, the rectangular plate-like part 61 farthest from the mirror part 12 in the y axis direction is the mode in which the rectangular plate-like part 61 is most distorted. On the other hand, unlike the third resonance mode (iii)-3 shown in FIG. 12, the third resonance mode (iii)-4 shown in FIG. 13 is a mode in which the pair of meander type actuator parts 16A and 16B are displaced in opposite phases. Here, the term "opposite phases" refers to a state in which displacements occur in the opposite orientations of the z axis direction between the rectangular plate-like parts 61, which are disposed at symmetrical positions with the first axis a1 set as the axis of symmetry, among the plurality of rectangular plate-like parts 61 included in each of the meander type actuator parts 16A and 16B. For example, in FIG. 13, in the meander type actuator part 16A, the rectangular plate-like part 61 disposed at the position farthest from the first axis a1 in the y axis direction is displaced such that the central portion thereof is recessed in the z axis direction. On the other hand, in the meander type actuator part 16B, the rectangular plate-like part 61 disposed at the position farthest from the first axis a1 in the y axis direction is displaced such that the central portion thereof is raised in the z axis direction.

Figure 14:
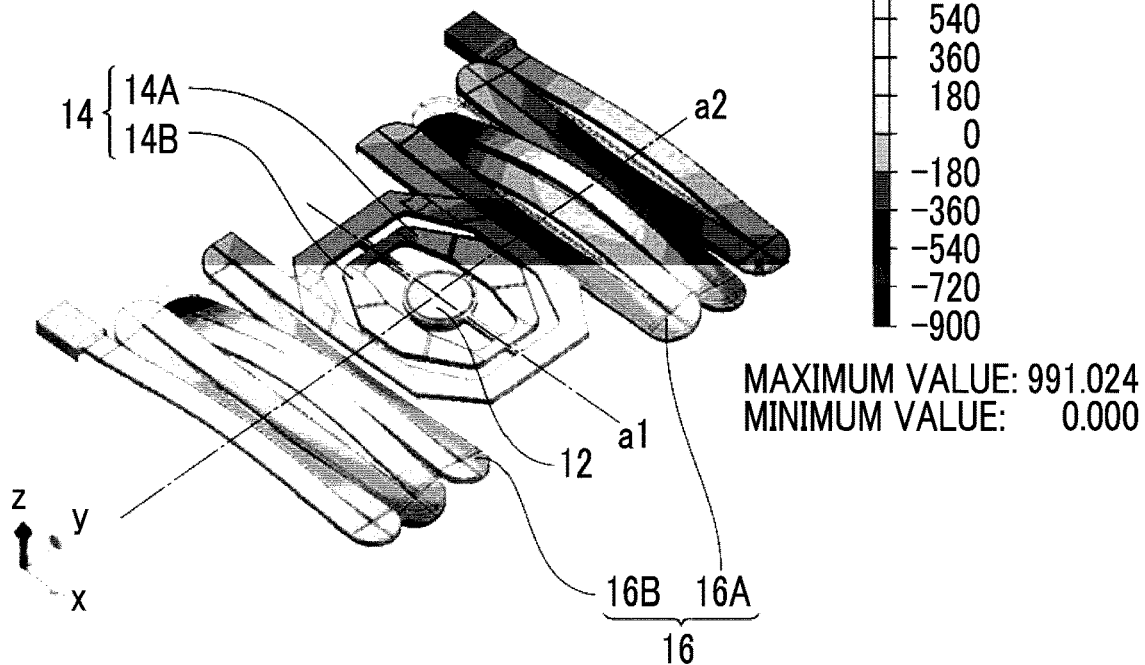
FIG. 14 is a simulation diagram of shape displacement in a resonance mode ((iii)-5 mode), which is one of the third resonance mode of the micromirror device.

The third resonance mode (iii)-5 shown in FIG. 14 is a mode in which the mirror part 12 and the first actuator 14 are hardly displaced, and the rectangular plate-like parts of the pair of meander type actuator parts 16A and 16B of the second actuator 16 are distorted in the z axis direction with the second axis a2 set as a center. Further, similarly to the third resonance mode (iii)-3 shown in FIG. 12, the resonance mode is a mode in which the pair of meander type actuator parts 16A and 16B are displaced in the same phase. However, unlike the case of the third resonance mode (iii)-3 shown in FIG. 12, the resonance mode is a mode in which the third rectangular plate-like part 61 on the first actuator 14 side among the rectangular plate-like parts 61 of each of the meander type actuator parts 16A and 16B is most distorted.

In a case where abnormal oscillation modes such as the second resonance mode (ii) and the third resonance modes (iii)-1 to (iii)-5 occur during driving performed by the first resonance mode (i), oscillation unnecessary for the reciprocating rotation of the mirror part 12 driven by the first resonance mode (i) about the first axis, that is, abnormal oscillation is superimposed thereon. Therefore, blurring occurs in the scanning lines in the width direction and the length direction, and it is difficult to obtain a desired scan angle.

On the other hand, according to the micromirror device 1 of the present disclosure, it is possible to suppress occurrence of the above-mentioned abnormal oscillation mode during driving in the first resonance mode (i). As a result, abnormal oscillation can be suppressed, occurrence of blurring of the scanning line can be suppressed, and highly accurate optical scanning can be realized.

The eigenfrequency of the micromirror device 1 is defined by the material, the shape, and the size of the elements constituting the micromirror device 1, and the eigenfrequency can be changed by adjusting the size of each element. Therefore, the size of each element may be adjusted such that the resonance frequency of the micromirror device 1 satisfies the above-mentioned relationship. In manufacturing the micromirror device 1, the reference size of each element is determined in accordance with the desired performance of the micromirror device 1. Based on these reference sizes, a simulation for obtaining the eigenfrequency is performed, and it is examined whether or not the eigenfrequency obtained by the simulation satisfies the above-mentioned relational expression. In a case where the above-mentioned relational expression is not satisfied, the size of one of the elements is changed. For example, one or greater of the following may be changed: the diameter of the mirror part 12, the length of the first connecting part 21 along the direction of the first axis a1 (that is, the length from the outer circumference of the mirror part 12 to the first actuator 14), the width of the first connecting part 21 in the direction of the second axis a2, the length of each of the rectangular plate-like parts 61 of the meander type actuator parts 16A and 16B along the direction of the first axis a1 and the width in the direction of the second axis a2, and the width and the second width of the first actuator 14 in the direction of the first axis a1 and the widths in the direction of the second axis a2.

Figure 15:
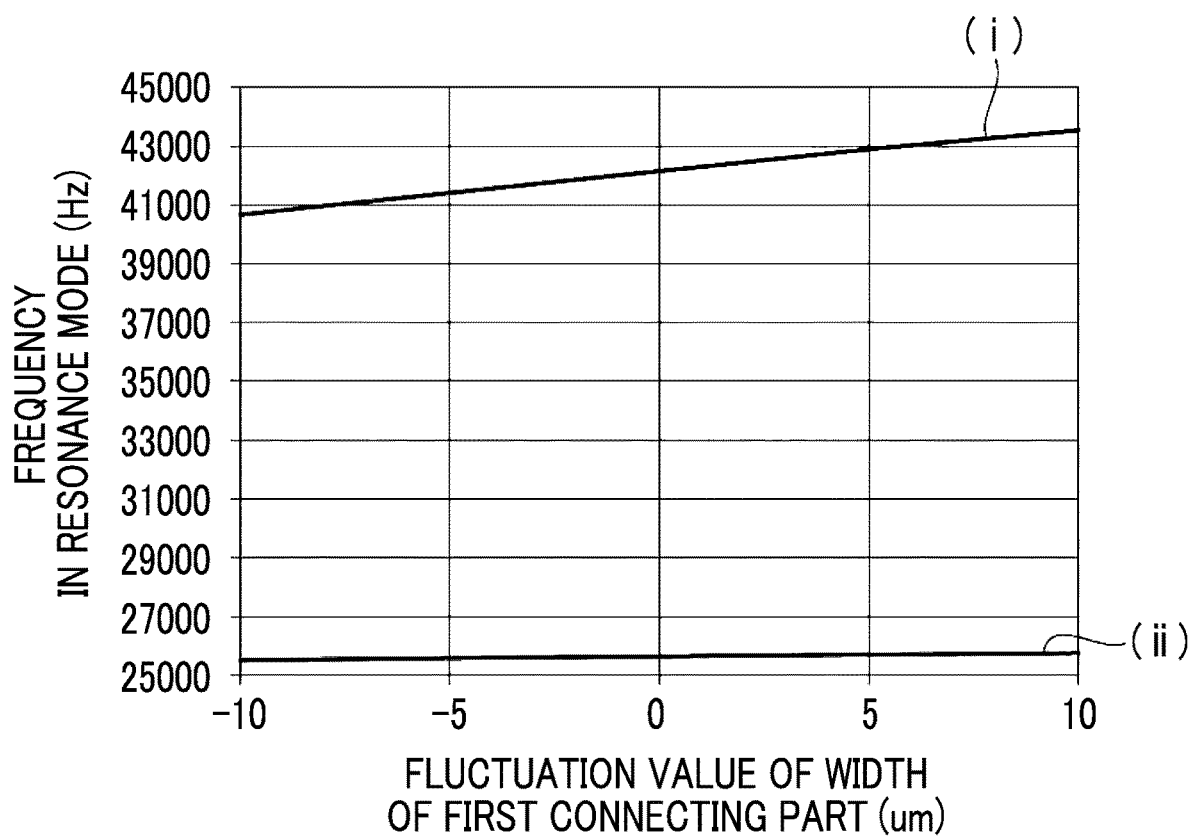
FIG. 15 is a diagram showing change in resonance frequency with change in size of some elements of the micromirror device.

For example, in a case where the width of the first connecting part 21 is changed in a range of ±10 μm, as shown in FIG. 15, the resonance frequency in the first resonance mode (i) of the micromirror device 1 fluctuates significantly. The larger the width of the first connecting part 21, the higher the resonance frequency in the first resonance mode (i). On the other hand, a resonance frequency in the second resonance mode (ii) is substantially constant. In such a manner, the resonance frequency of the micromirror device 1 and the relationship thereof can be changed by changing the size of a part of the constituent elements.

Hereinafter, each element of the micromirror device 1 will be described in detail.

The mirror part 12 has a reflecting surface 12a that reflects incident light. The reflecting surface 12a consists of a metal thin film such as Au (gold) and Al (aluminum) provided on one surface of the mirror part 12. The material and film thickness used for the mirror coating for forming the reflecting surface 12a are not particularly limited, and various designs can be made using a known mirror material (a high reflectance material). Further, in the present example, as shown in FIG. 4, in order to maintain the flatness of the reflecting surface on the rear surface of the mirror part 12, a circular rib along the outer peripheral shape and three ribs 13, which are parallel to the second axis a2, in the circular rib are provided.

FIG. 1 exemplifies a mirror part 12 having an approximately circular reflecting surface 12a and having a plan view shape similar to the reflecting surface 12a. However, the plan view shape of the mirror part 12 and the shape of the reflecting surface 12a may be the same or different. The shapes of the mirror part 12 and the reflecting surface 12a are not particularly limited. Not limited to the circular shape exemplified, there may be various shapes such as an ellipse, a square, a rectangle, and a polygon.

The first connecting part 21 is composed of a pair of rod-like members extending symmetrically outward along the first axis a1 from the outer circumference of the mirror part 12. The mirror part 12 and the first actuator 14 are connected on the first axis a1, and the mirror part 12 is supported to be rotatable about the first axis a1. One end of each of the first connecting parts 21 is connected to the outer circumference of the mirror part 12, and the other end of each is connected to the first actuator 14.

The first actuator 14 includes a pair of semi-annular actuator parts 14A and 14B, respectively, which comprise first piezoelectric elements 41 and 42. The pair of semi-annular actuator parts 14A and 14B are connected on the first axis a1 and are disposed in an annular shape around the mirror part 12.

Here, the annular shape may be any shape that surrounds the inner region without interruption, and the inner and outer peripheries may not be circular, and is a concept including a rectangular shape or a polygonal shape.

By bending the semi-annular actuator part 14A and the semi-annular actuator part 14B, which are disposed with the first axis a1 interposed therebetween, in opposite directions, a torque can be generated around the first axis a1. Thereby, the mirror part 12 is rotated about the first axis a1.

The second connecting part 22 is composed of a pair of rod-like members that are symmetrically extended from the outer circumference of the first actuator 14 to the outside along the first axis a1, and the first actuator 14 and the movable frame 18 are connected on the first axis a1.

As described above, the second actuator 16 consists of a pair of meander type actuator parts 16A and 16B disposed between the first actuator 14 and the fixing unit 20. The pair of meander type actuator parts 16A and 16B are disposed symmetrically with respect to the first axis a1 with the movable frame 18, the first actuator 14, and the mirror part 12 interposed therebetween. The coupling part 62 provided at one end of the meander type actuator parts 16A and 16B is connected to the outer circumference of the first actuator 14, and the coupling part 62 provided at the other end is connected to the fixing unit 20.

Each of the rectangular plate-like parts 61 of the meander type actuator parts 16A and 16B functions as a piezoelectric cantilever. In order to generate torque about the second axis, adjacent rectangular plate-like parts 61 may be bent in opposite directions. Thereby, tilt angles generated at the ends of the respective rectangular plate-like parts 61 are accumulated, and the sum thereof is a tilt of the first actuator 14 (=tilt of the mirror part 12). Therefore, a voltage is applied to the second piezoelectric elements 44 of the adjacent rectangular plate-like parts 61 and to the second piezoelectric elements 46 such that stress occurs in the opposite direction. Specifically, the phase of the voltage waveform applied thereto may be shifted by 180°. In such a manner, the second actuator 16 is able to generate rotational torque in the first actuator 14 and the mirror part 12.

In the present example, in the meander type actuator parts 16A and 16B, the number of the rectangular plate-like parts 61 is six, but the number of the rectangular plate-like parts 61 is not limited as long as the number is one or greater. In a case where there is only one rectangular plate-like part 61, the coupling part provided at one end thereof is connected to the outer circumference of the semi-annular actuator part 14A or 14B, and the coupling part provided at the other end is connected to the inner periphery of the fixing unit 20. As a result, the two coupling parts and the rectangular plate-like part 61 are configured to form a meander shape as a whole. However, it is preferable that one meander type actuator part 16A and 16B includes two or greater rectangular plate-like parts 61, and it is preferable that the number of rectangular plate-like parts 61 is an even number from the viewpoint of suppressing warping in a case where the micromirror device 1 is stationary.

In the present example, the second actuator 16 is composed of a pair of meander type actuator parts 16A and 16B. However, the second actuator 16 may have a different shape as long as the mirror part 12 and the first actuator 14 are integrally reciprocally rotatable about the second axis a2.

The movable frame 18 has a function of transferring the rotational torque of the second actuator 16 to the first actuator 14 and the mirror part 12. However, the micromirror device 1 may not comprise the movable frame 18 and the second connecting part 22, and the second actuator 16 may be directly connected to the first actuator 14.

The fixing unit 20 supports the second actuator 16 and supports the movable frame 18, the first actuator 14, and the mirror part 12 through the second actuator 16. The fixing unit 20 is provided with wiring, electrode terminals, and the like not shown in the drawing. Further, the fixing unit 20 may be further provided with an electronic circuit not shown in the drawing.

In the present example, the fixing unit 20 is a frame member that surrounds the second actuator 16. The fixing unit 20 is not limited to the frame member, and may be composed of two members including a first fixing unit connected to one meander type actuator part 16A and a second fixing unit connected to the other meander type actuator part 16B.

In the micromirror device 1 of the present example, the mirror part 12, the first actuator 14, the movable frame 18, the second actuator 16, the fixing unit 20, the first connecting part 21, and the second connecting part 22 are disposed to have a line-symmetrical structure in the first axis a1. With such a symmetrical structure, rotational torque can be efficiently applied to the central mirror part 12.

The micromirror device 1 can be manufactured as a structure, in which elements such as the mirror part 12, the first actuator 14, the second actuator 16, the fixing unit 20, and the connecting parts 21, 22 are integrally formed, for example, by being processed from a silicon substrate through a semiconductor manufacturing technology.

The fixing unit 20 is thicker than the mirror part 12, the first actuator 14, the movable frame 18, the second actuator 16, the first connecting part 21, and the second connecting part 22 (refer to FIGS. 3 and 4). That is, the thicknesses of the mirror part 12, the first actuator 14, the movable frame 18, the second actuator 16, the first connecting part 21, and the second connecting part 22 are formed to be less than the thickness (thickness in the z axis direction) of the fixing unit 20. Thereby, the first actuator 14, the second actuator 16, the first connecting part 21, and the second connecting part 22 each have a structure which tends to cause deformation (bending deformation or twisting deformation). The substrate part is referred to as a structure for a micromirror device. The substrate part excludes the reflecting surface, the piezoelectric film, the electrodes, the wiring, and the like in the mirror part 12, the first actuator 14, the second actuator 16, and the fixing unit 20. Further, the part of this structure excluding the fixing unit 20 is the body part in the structure. The basic performance of the micromirror device 1 depends on the shape of the body part and does not depend on the shape of the fixing unit 20.

The upper electrodes 33 of the first piezoelectric elements 41 and 42 provided in the pair of semi-annular actuator parts 14A and 14B of the first actuator 14 may each be composed of a plurality of individual electrode parts.

The piezoelectric elements 41, 42, 44, and 46 provided in the first actuator 14 and the second actuator 16 will be described. As described above, the piezoelectric elements 41, 42, 44, and 46 each have a laminate structure of the lower electrode 31, the piezoelectric film 32, and the upper electrode 33.

The thickness of the lower electrode and the upper electrode is not particularly limited, and is, for example, about 200 nm. The thickness of the piezoelectric film is not particularly limited as long as it is 10 μm or less, and is usually 1 μm or greater, for example, 1 to 5 μm. The method for forming the lower electrode, the upper electrode and the piezoelectric film is not particularly limited, but the vapor deposition method is preferable, and the sputtering method is particularly preferable.

The main components of the lower electrode are not particularly limited, and are metals or metal oxides such as Au, Pt, Ir, $IrO_2$, $RuO_2$, $LaNiO_3$, and $SrRuO_3$, and combinations thereof.

The main component of the upper electrode is not particularly limited, and examples thereof include materials exemplified for the lower electrode, electrode materials generally used in semiconductor processes such as Al, Ti, Ta, Cr, and Cu, and combinations thereof.

Examples of the piezoelectric film include those containing one or greater types of perovskite-type oxides (P) represented by the following expression.

General Expression $ABO_3$ (P)

(In the Expression, A is an element of A site, and at least one element containing Pb.

B is an element of B site, and is at least one element selected from the group consisting of Ti, Zr, V, Nb, Ta, Sb, Cr, Mo, W, Mn, Sc, Co, Cu, In, Sn, Ga, Zn, Cd, Fe, and Ni.

O is an oxygen element.

The standard molar ratio of A-site element, B-site element, and oxygen element is 1:1:3, but the molar ratio may deviate from the reference molar ratio within a range in which a perovskite structure can be obtained.)

Examples of the perovskite-type oxide represented by the above-mentioned general Expression include lead-containing compounds such as lead titanate, lead zirconate titanate (PZT), lead zirconate tit, lead zirconate tit lanthanate, lead zirconate titanate lanthanate, lead zirconate titanate magnesium niobate, lead zirconate titanate titanate, and lead zirconate titanate zinc niobate, and mixed crystal systems thereof; lead-free compounds such as barium titanate, strontium barium titanate, bismas sodium niobate, potassium niobate potassium, niobate, sodium, potassium niobate, lithium niobate, and bismas ferrite, and mixed crystal systems thereof.

Further, the piezoelectric film of the present embodiment preferably contains one kind or two or greater kinds of perovskite-type oxides (PX) represented by the following expression.

$$A_a(Zr_x,Ti_y,M_{b-x-y})_bO_c (PX)$$

(In the Expression, A is an element of A site, and at least one element containing Pb. M is at least one element selected from a group which consists of V, Nb, Ta, and Sb.

$0<x<b$, $0<y<b$, $0 \leq b-x-y$, and $a:b:c=1:1:3$ are standard, but these molar ratios may deviate from the reference molar ratio within the range where a perovskite structure can be obtained.)

The piezoelectric film consisting of the perovskite-type oxide represented by the above-mentioned general Expressions (P) and (PX) has a high piezoelectric strain constant ($d_{31}$ constant). Therefore, the actuator comprising such a piezoelectric film is excellent in displacement characteristics. The perovskite-type oxide represented by the general Expression (PX) has a higher piezoelectric constant than that represented by the general Expression (P).

Further, the actuator comprising the piezoelectric film which consists of the perovskite-type oxide represented by the general Expressions (P) and (PX) has a voltage-displacement characteristic with excellent linearity in the driving voltage range. These piezoelectric materials exhibit favorable piezoelectric properties in carrying out the technique of the present disclosure.

Test Example

Hereinafter, micromirror devices of Examples and Comparative Examples of techniques of the present disclosure will be described. Test Examples 1 to 16 were manufactured as the following examples and comparative examples. Test Examples 1 to 12 correspond to Examples, and Test Examples 13 to 16 correspond to Comparative Examples.

Figure 16:
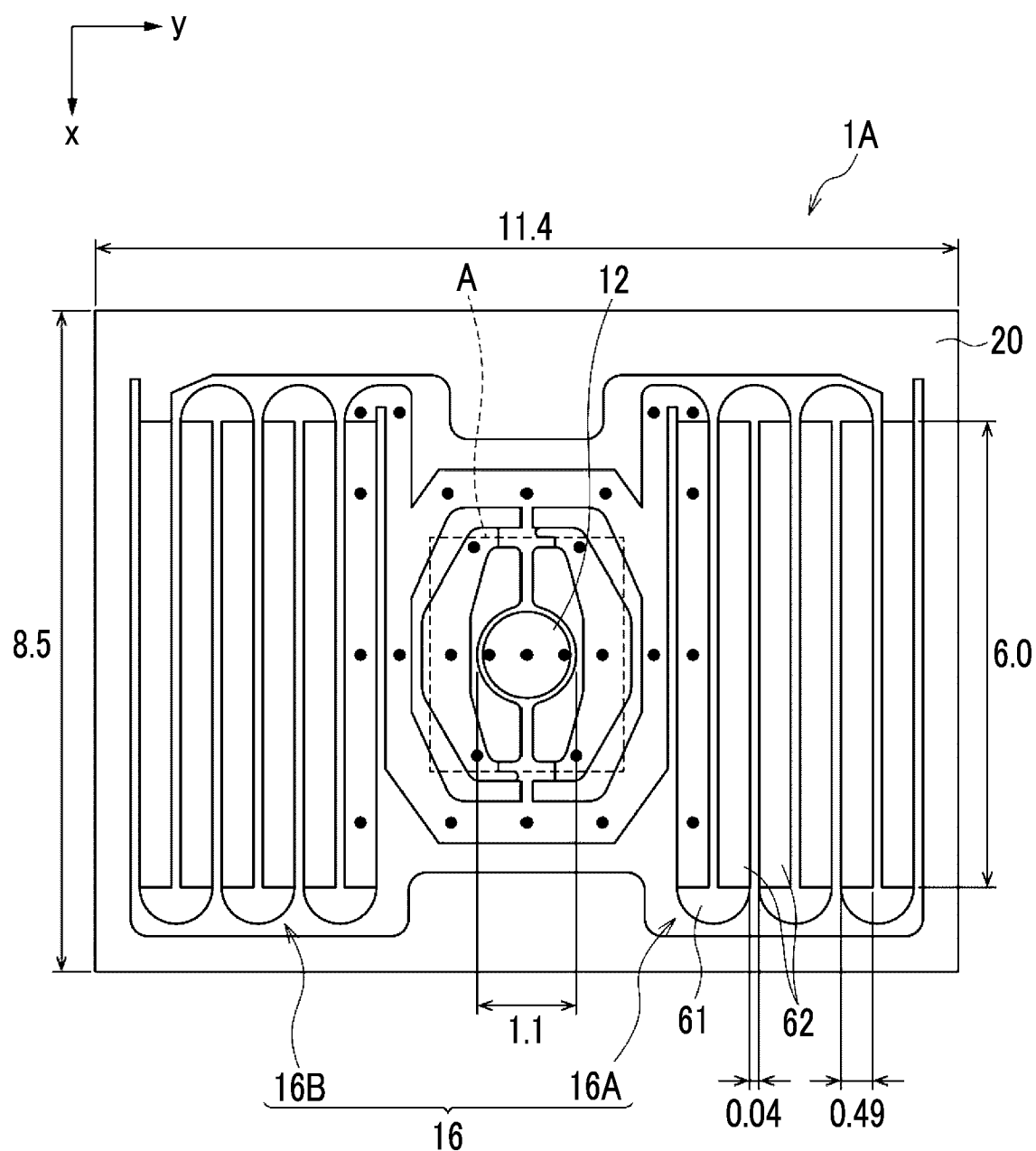
FIG. 16 is a diagram showing dimensions of a micromirror device of a test example.
Figure 17:
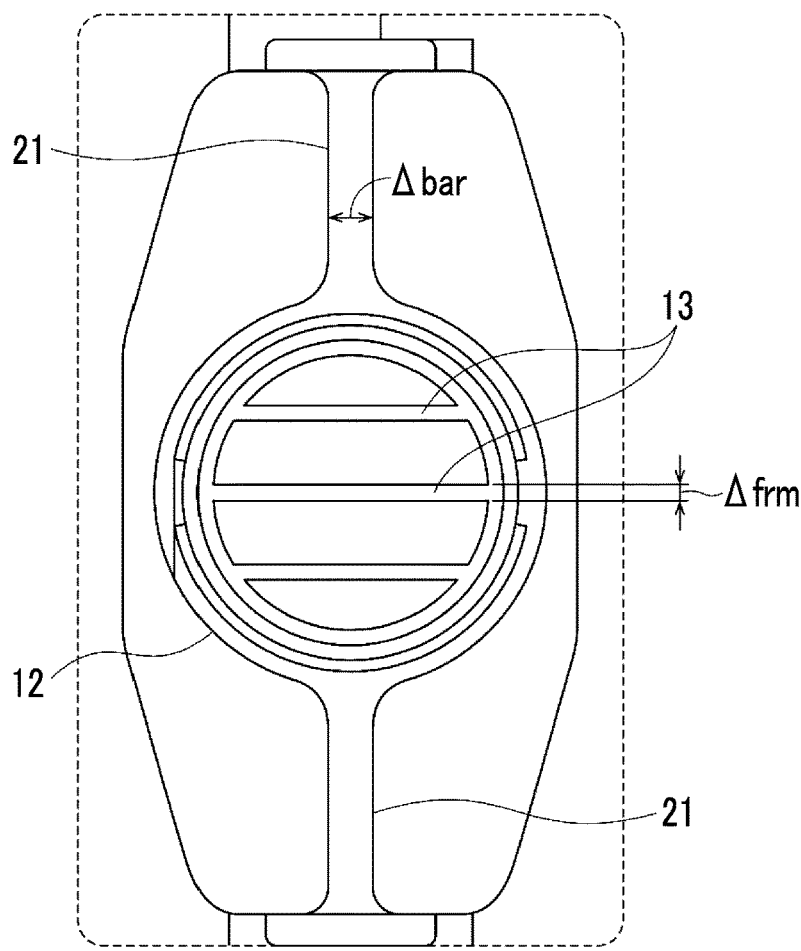
FIG. 17 is a diagram showing a resized portion of the micromirror device of the test example.

The micromirror devices 1A whose plan views are shown in FIG. 16 were manufactured as Test Examples 1 to 16 by the following procedure. The micromirror devices 1A has the same shape as the micromirror device 1 shown in FIG. 1, and the same elements are represented by the same reference numerals. FIG. 17 is a view showing the rear surface of the mirror part 12 surrounded by the broken line A in FIG. 16.

—Manufacturing Method—

(Step 1) As a structural substrate, a silicon on insulator (SOI) substrate was used. The SOI substrate has a laminated structure including a rear surface silicon oxide ($SiO_2$) layer of 1.5 μm, a Si handle layer of 250 μm, a silicon oxide box layer of 1 μm, a Si device layer of 100 μm, and a front surface silicon oxide of 1 μm. A Ti layer of 30 nm and an Ir layer of 150 nm were formed on the surface oxide layer of 1 μm of the SOI substrate by a sputtering method at a substrate temperature of 350° C. The laminated structures of the Ti layer and the Ir layer correspond to the lower electrode 31 in FIG. 2.

(Step 2) A piezoelectric film with 3 μm was formed on the substrate on which the lower electrodes (Ti/Ir) obtained above were laminated and formed using a radio frequency (RF) sputtering device. As the target material for sputtering film formation for the piezoelectric film, a material having a composition of $Pb_{1.3}((Zr_{0.52}Ti_{0.48})_{0.88}Nb_{0.12})O_3$ was used. The film forming pressure was 2.2 mTorr, and the film forming temperature was 450° C. The obtained piezoelectric film was an Nb-doped PZT thin film to which Nb was added at an atomic composition ratio of 12%.

(Step 3) An upper electrode having a laminated structure of Au/Ir (150 nm/50 nm) was patterned by a lift-off method on the substrate on which the piezoelectric film obtained above was formed.

(Step 4) After that, the piezoelectric film and the lower electrode were pattern-etched by inductively coupled plasma (ICP) dry etching.

(Step 5) An insulating layer made of $Al_2O_3$ having a thickness of 0.6 μm was formed on the entire surface thereof, and then the insulating layer was patterned by the ICP dry etching.

(Step 6) A laminated structure of Au/Ti (300 nm/50 nm) was formed into a pattern, and a reflecting surface 12a of a mirror part 12, an electrode terminal, and a wiring layer were formed, by the lift-off method.

(Step 7) The device layer was pattern-etched by a silicon dry etching process to process the shapes of the first actuator 14, the second actuator 16, the movable frame 18, the mirror part 12, the first connecting part 21, the second connecting part 22, and the fixing unit 20.

(Step 8) Next, the handle layer was subject to deep-drilled reactive ion etching from the rear surface of the substrate. Basically, the handle layer was removed such that a part to be a fixing unit 20 remains.

(Step 9) Finally, the micromirror device described with reference to FIG. 16 was manufactured by removing the box layer from the rear surface by dry etching.

In the above-mentioned manufacturing step, the reflecting surface 12a of the mirror part 12 is formed in Step 6, but the reflecting surface 12a may be formed by using a reflective material different from the material of the electrode terminal and the wiring layer. In that case, for example, subsequently to Step 6, the reflecting surface 12a may be formed by a lift-off method or the like.

The size of each element of the micromirror device 1A of the present test example was as shown in FIG. 16. A diameter of the mirror part 12 was set to 1.1 mm, a length of each of the rectangular plate-like parts 61 of the meander type actuator parts 16A and 16B along the x axis direction (direction of the first axis a1) was set to 6.0 mm, and a width in the y axis direction (direction of the second axis a2) was set to 0.49 mm, and a spacing between the adjacent rectangular plate-like parts 61 was set to 0.04 mm. The outer shape of the fixing unit 20 was set to 11.4 mm in the y axial direction and 8.5 mm in the x axis direction. Further, the thicknesses of the mirror part 12, the first actuator 14, the second actuator 16, and the first connecting part 21 and the second connecting part 22 are equal to the thickness of the device layer. However, as shown in FIG. 17, on the rear surface of the mirror part 12, circular ribs along the outer circumference and three parallel ribs 13 are provided in the circular ribs. A thickness of the rib 13 was set to 250 μm.

In each of Test Examples 1 to 16, a width Δbar of the first connecting part 21 supporting the mirror part 12 and a width Δfrm of the rib 13 of the mirror part 12 were set to sizes shown in Table 1.

For the micromirror device of each test example, the correlation between the frequency and the frequency difference in the resonance mode and presence or absence of occurrence of abnormal oscillation was examined.

(Frequency and Frequency Difference of Various Resonance Modes)

Regarding the micromirror devices of Test Examples 1 to 16, a chirp signal (instantaneous frequency of 0 to 100 kHz) having a voltage amplitude of 2 V was applied to the first piezoelectric elements 41 and 42 of the first actuator 14 by using a laser Doppler oscillation meter (MSA-500 MICRO SYSTEM ANALYZER manufactured by Polytec Co., Ltd), and displacements of a plurality of measurement points on the micromirror device 1A were measured. As indicated by black circles (•) in FIG. 16, the measurement points were set at a plurality of positions for the respective rectangular plate-like parts 61 closest to the mirror part 12, the semi-annular actuator parts 14A and 14B of the first actuator 14, the movable frame 18, and the movable frames 18 of the meander-like actuator parts 16A and 16B of the second actuator 16. A frequency spectrum of the displacement at each measurement point acquired by the laser Doppler oscillation meter was acquired by FFT processing, and an oscillation frequency was obtained from an average spectrum of the frequency spectrum of each measurement point. Further, the oscillation shape of each oscillation mode was obtained from the phase relationship between the measurement points. As conditions for the FFT processing, a sampling frequency was set to 256 Hz, a sampling time was set to 1024 ms, and a frequency resolution was set to 0.9766 Hz. The frequency in the resonance mode was identified from the average spectrum of the frequency spectra of the measurement points.

In the plurality of resonance modes obtained as described above, a resonance frequency A in the first resonance mode (i), which is the lowest order, among the resonance modes in which the mirror part 12 and the first actuator 14 reciprocally rotate about the first axis a1 (the axis parallel to the x-axis) in opposite phases, and a resonance frequency B of the second resonance mode (ii), which is the lowest order, among the resonance modes in which the mirror part 12 and the first actuator 14 oscillate in opposite phases in a direction (z axis direction) orthogonal to both and both the first axis a1 (x axis) and the second axis a2 direction (y axis) are extracted.

Then, $F = A - B$ were calculated.

Further, among the respective frequencies of the plurality of resonance modes obtained as described above, a frequency in the resonance mode having a frequency near F is extracted. For each of the micromirror devices of Test Examples 1 to 16, there was a mode of the third resonance modes (iii)-1 to (iii)-5 as the peripheral mode of F.

Further, among the third resonance modes (iii)-1 to (iii)-5, a resonance frequency less than F and closest to F was extracted as the resonance frequency C. Further, among the third resonance modes (iii)-1 to (iii)-5, a resonance frequency greater than F and closest to F was extracted as the resonance frequency D. Then, $\Delta F1 = F - C$, and $\Delta F2 = F - D$ were respectively calculated.
(Evaluation)

Regarding the micromirror devices of Test Examples 11 to 16, a sinusoidal signal of the resonance frequency A in the first resonance mode (i) was input to the first actuator 14, and a first axis scanning operation for rotating the mirror part 12 about the first axis was performed. The voltage amplitude was gradually increased, and the displacement angle of the mirror part 12 was gradually increased, and presence or absence of occurrence of abnormal oscillation and the displacement angle of the mirror part 12 in the case where abnormal oscillation was generated were examined. Specifically, a visible light laser was vertically incident on the reflecting surface 12a of the mirror part 12 of the micromirror device, the reflected light was detected by a two-dimensional photodetector, and presence or absence of abnormal oscillation was determined on the basis of presence or absence of blurring of the scanning line. In a test example in which the Si fracture stress was reached without causing abnormal oscillation in a case where the voltage amplitude was gradually increased and the mirror part 12 was broken, 15°, which is a breaking limit angle, was assumed as the maximum displacement angle. Further, in a case where abnormal oscillation occurs before the breaking limit is reached, the angle at the time of occurrence was assumed as the maximum displacement angle. Further, in Table 1, in a case where abnormal oscillation does not occur up to the breaking limit of the mirror part 12, the term "no occurrence" is noted, and in a case where abnormal oscillation occurs at an angle less than the breaking limit, the term "occurrence" is noted.

Further, as the evaluations, in the case where abnormal oscillation does not occur up to the breaking limit, A was noted, in the case where abnormal oscillation occurs and the maximum displacement angle is equal to or greater than 6°, B was noted, and in the case where the maximum displacement angle is less than 6°, C was noted. In a case where the micromirror device is applied to a laser display, it is considered that a displacement angle of at least ±6° is required. Further, in a case where a displacement angle of greater than ±12° is obtained, a very high-definition image can be realized.

Table 1 shows the size, various frequencies, frequency differences, and evaluation results of the constituent elements of each example.

TABLE 1

| Test ewxample No. | Δbar (μm) | Δfrm (μm) | (i)Mode frequency A (Hz) | (ii)Mode frequency B (Hz) | F: A − B (Hz) | (iii)-1 Frequency (Hz) | (iii)-2 Frequency (Hz) | (iii)-3 Frequency (Hz) | (iii)-4 Frequency (Hz) | (iii)-5 Frequency (Hz) |
|---|---|---|---|---|---|---|---|---|---|---|
| 1 | 140 | 45 | 40658 | 25500 | 15158 | 14956 | 16220 | 16859 | 16866 | 17768 |
| 2 | 150 | 40 | 42927 | 25815 | 17112 | 14997 | 16230 | 16859 | 16867 | 17768 |
| 3 | 150 | 54 | 40949 | 25327 | 15622 | 14891 | 16220 | 16859 | 16867 | 17768 |
| 4 | 150 | 55 | 40826 | 25295 | 15531 | 14884 | 16219 | 16859 | 16867 | 17768 |
| 5 | 155 | 45 | 42901 | 25693 | 17208 | 14960 | 16228 | 16859 | 16867 | 17768 |
| 6 | 150 | 47 | 41871 | 25561 | 16310 | 14944 | 16225 | 16859 | 16867 | 17768 |
| 7 | 148 | 45 | 41854 | 25607 | 16247 | 14958 | 16226 | 16859 | 16867 | 17768 |
| 8 | 145 | 45 | 41410 | 25568 | 15842 | 14958 | 16224 | 16859 | 16867 | 17768 |
| 9 | 150 | 45 | 42158 | 25632 | 16526 | 14959 | 16226 | 16859 | 16867 | 17768 |
| 10 | 150 | 51 | 41329 | 25425 | 15904 | 14914 | 16222 | 16859 | 16867 | 17768 |
| 11 | 146 | 45 | 41564 | 25582 | 15982 | 14958 | 16224 | 16859 | 16867 | 17768 |
| 12 | 150 | 50 | 41461 | 25458 | 16003 | 14921 | 16223 | 16859 | 16867 | 17768 |
| 13 | 150 | 43 | 42456 | 25704 | 16752 | 14974 | 16228 | 16859 | 16867 | 17768 |
| 14 | 150 | 49 | 41595 | 25492 | 16103 | 14929 | 16223 | 16859 | 16867 | 17768 |
| 15 | 147 | 45 | 41739 | 25594 | 16145 | 14958 | 16225 | 16859 | 16867 | 17768 |
| 16 | 150 | 48 | 41732 | 25527 | 16205 | 14936 | 16224 | 16859 | 16867 | 17768 |

TABLE 1-continued

| Test ewxample No. | C correspondence mode | ΔF1: F − C (Hz) | D correspondence mode | ΔF2: F − D (Hz) | Maximum displacement angle (±deg) | Abnomal oscillation | Evaluation |
|---|---|---|---|---|---|---|---|
| 1 | (iii)-1 | 202 | (iii)-2 | −1062 | 15 | No occurrence | A |
| 2 | (iii)-4 | 245 | (iii)-5 | −656 | 15 | No occurrence | A |
| 3 | (iii)-1 | 731 | (iii)-2 | −598 | 15 | No occurrence | A |
| 4 | (iii)-1 | 647 | (iii)-2 | −688 | 15 | No occurrence | A |
| 5 | (iii)-4 | 341 | (iii)-5 | −560 | 15 | No occurrence | A |
| 6 | (iii)-2 | 85 | (iii)-3 | −549 | 12 | Occurrence | B |
| 7 | (iii)-2 | 21 | (iii)-3 | −612 | 6.2 | Occurrence | B |
| 8 | (iii)-1 | 884 | (iii)-2 | −382 | 11 | Occurrence | B |
| 9 | (iii)-2 | 300 | (iii)-3 | −333 | 10.2 | Occurrence | B |
| 10 | (iii)-1 | 990 | (iii)-2 | −318 | 10.1 | Occurrence | B |
| 11 | (iii)-1 | 1024 | (iii)-2 | −242 | 9 | Occurrence | B |
| 12 | (iii)-1 | 1082 | (iii)-2 | −220 | 7.4 | Occurrence | B |
| 13 | (iii)-2 | 524 | (iii)-3 | −107 | 5.7 | Occurrence | C |
| 14 | (iii)-1 | 1174 | (iii)-2 | −120 | 5.6 | Occurrence | C |
| 15 | (iii)-1 | 1187 | (iii)-2 | −80 | 3.5 | Occurrence | C |
| 16 | (iii)-1 | 1269 | (iii)-2 | −19 | 0.5 | Occurrence | C |

As shown in Table 1, Test Examples 1 to 12, in which the evaluations A or B were obtained, satisfy $\Delta F1 = F - C \geq 20$ Hz and $\Delta F2 = F - D \leq -150$ Hz. On the other hand, in Test Examples 13 to 16 having the evaluation C, $\Delta F2$ was a value greater than −150 Hz.

Figure 18:
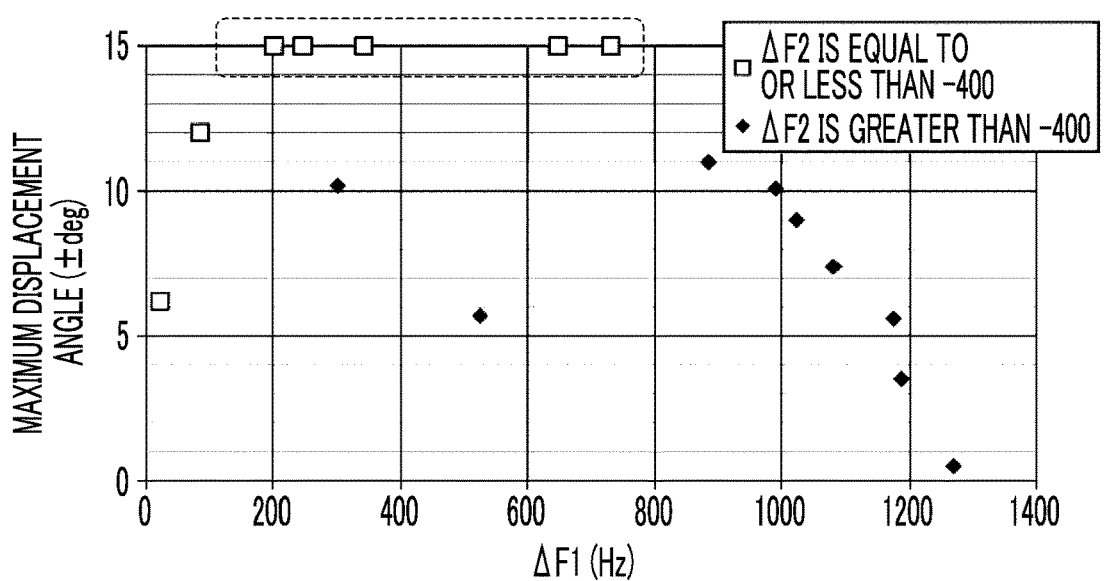
FIG. 18 is a graph showing a relationship between $\Delta F1$ and a maximum displacement angle with respect to the test example.

FIG. 18 is a graph showing a relationship between $\Delta F1$ and the maximum displacement angle for Test Examples 1 to 16. In the drawing, a square (□) marker indicates a test example in which $\Delta F2$ is equal to or less than −400 Hz, and a diamond-shaped ( ) marker indicates a test example in which $\Delta F2$ is greater than −400 Hz. From FIG. 18, it can be seen that in Test Examples 1 to 7 in which $\Delta F2$ is equal to or less than −400 Hz, the closer $\Delta F1$ is to 0, the smaller abnormal oscillation occurs at the displacement angle. In Test Examples 6 and 7 in which $\Delta F1$ was 100 Hz or less, a maximum displacement angle of ±6° or greater could be achieved, but a maximum displacement angle of greater than ±12° could not be obtained.

Figure 19:
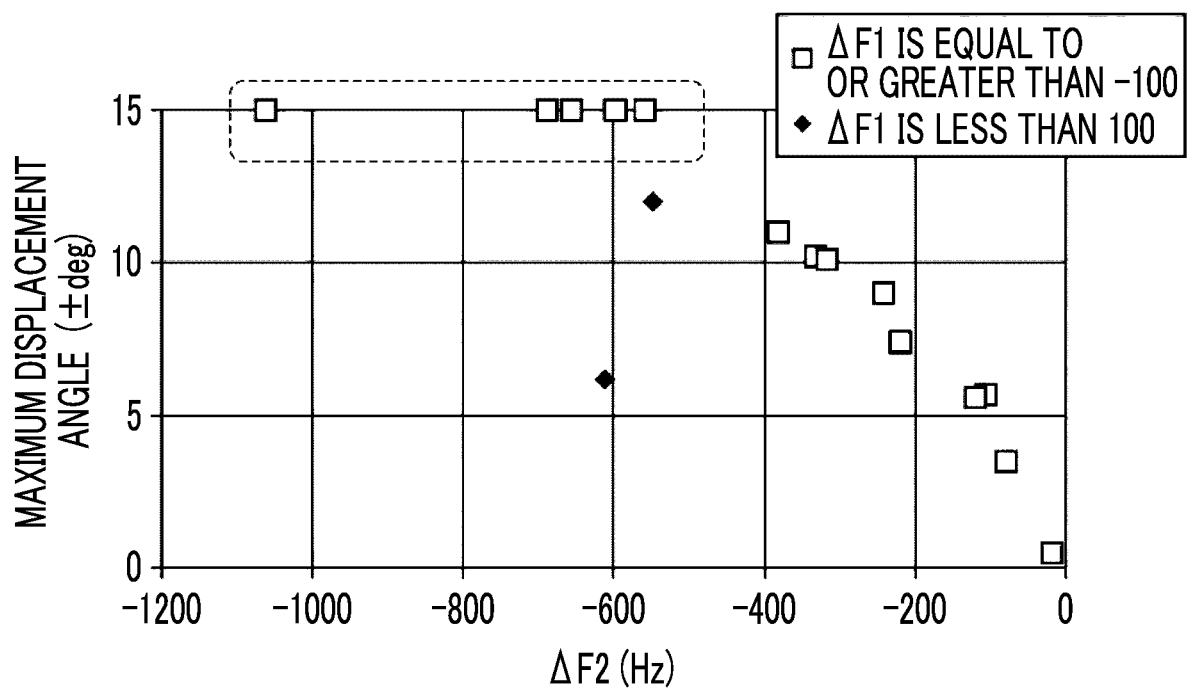
FIG. 19 is a graph showing a relationship between $\Delta F2$ and a maximum displacement angle according to the test example.

FIG. 19 is a graph showing a relationship between $\Delta F2$ and the maximum displacement angle for Test Examples 1 to 16. In the drawing, a square (□) marker indicates a test example in which $\Delta F1$ is equal to or greater than 100 Hz, and a diamond-shaped ( ) marker indicates a test example in which $\Delta F1$ is less than 100 Hz. From FIG. 19, it can be seen that in Test Examples 1 to 5 and 8 to 16 in which $\Delta F1$ is equal to or greater than 100 Hz, the closer $\Delta F2$ is to 0, the smaller abnormal oscillation occurs at the displacement angle. As described above, in Test Examples 13 to 16 in which $\Delta F2$ is greater than −150 Hz, the maximum displacement angle±6° could not be obtained. In Test Examples 8 to 12 in which $\Delta F2$ is equal to or less than −150 Hz but greater than −400 Hz, a maximum displacement angle of ±6° or greater could be achieved, but a maximum displacement angle of greater than ±12° could not be obtained.

On the other hand, in Test Examples 1 to 5 in which $\Delta F1$ surrounded by the broken line in FIGS. 18 and 19 was equal to or greater than 100 Hz and $\Delta F2$ was equal to or less than −400 Hz, abnormal oscillation did not occur up to the breaking limit.

That is, by satisfying $\Delta F1 = F - C \geq 20$ Hz and $\Delta F2 = F - D \leq -150$ Hz, a displacement angle of ±6° or greater suitable for the laser display application can be realized. In addition, by satisfying $\Delta F1 = F - C \geq 100$ Hz and $\Delta F2 = F - D \leq -400$ Hz, a displacement angle of greater than ±12° can be realized. Thus, it can be said that very high-definition optical scanning is possible.

In carrying out the technique of the present disclosure, the present disclosure is not limited to the configuration and manufacturing method of the present test example, and the substrate material, electrode material, piezoelectric material, film thickness, film forming conditions, and the like may be appropriately selected in accordance with the purpose.

The present disclosure of JP2020-076928A filed on Apr. 23, 2020 is incorporated herein by reference in its entirety.

All documents, patent applications, and technical standards described in the present specification are incorporated into the present specification by reference to the same extent as in a case where the individual documents, patent applications, and technical standards were specifically and individually stated to be incorporated by reference.

What is claimed is:

1. A micromirror device that has a mirror part having a reflecting surface which reflects incident light and that changes two-dimensionally an orientation of the reflecting surface by reciprocally rotating the mirror part about two axes of a first axis and a second axis intersecting each other, the micromirror device comprising:
   a first actuator that has first piezoelectric elements disposed in an annular shape around the mirror part, the first actuator being connected to the mirror part and reciprocally rotating the mirror part about the first axis by periodically deforming the first piezoelectric elements; and
   a second actuator that has second piezoelectric elements, the second actuator reciprocally rotating the mirror part about the second axis by periodically deforming the second piezoelectric elements,
   wherein assuming that
      a resonance frequency in a lowest-order resonance mode as a resonance mode, in which the mirror part and the first actuator reciprocally rotate about the first axis in opposite phases with each other, among a plurality of resonance modes having different resonance frequencies is A,
      a resonance frequency in a lowest-order resonance mode as a resonance mode, in which the mirror part and the first actuator oscillate in opposite phases in a direction orthogonal to both the first axis and the second axis, among the plurality of resonance modes, is B, a difference A-B between the resonance frequency A and the resonance frequency B is a frequency difference F, a resonance frequency in a resonance mode having a resonance frequency of a frequency less than the frequency difference F as a resonance mode having a resonance frequency closest to the frequency difference F among the plurality of resonance modes is C, and a resonance frequency in a resonance mode having a resonance frequency of a frequency greater than the frequency difference F as a resonance mode having a resonance frequency closest to the frequency difference F among the plurality of resonance modes is D, a difference $\Delta F1$ between the frequency difference F and the resonance frequency C satisfies $\Delta F1 = F - C \geq 20$ Hz, a difference $\Delta F2$ between the frequency difference F and the resonance frequency D satisfies $\Delta F2 = F - D \leq -150$ Hz.

2. The micromirror device according to claim 1, wherein the difference $\Delta F1$ and the difference $\Delta F2$ satisfy $\Delta F1 \geq 100$ Hz, and $\Delta F2 \leq -400$ Hz.

3. The micromirror device according to claim 1, wherein the mirror part and the first actuator are connected through a first connecting part extending along the first axis.

4. The micromirror device according to claim 1, further comprising:

a movable frame that has an annular shape to surround the first actuator; and a second connecting part that connects the movable frame and the first actuator, wherein the second actuator reciprocally rotates the mirror part about the second axis through the movable frame.

5. The micromirror device according to claim 4, wherein the second connecting part extends along the first axis.

6. The micromirror device according to claim 1, wherein the second actuator includes two or greater rectangular plate-like parts, and includes a meander structure in which the two or greater rectangular plate-like parts are folded back in a meander shape with a coupling part interposed therebetween, and each of the two or greater rectangular plate-like parts includes the second piezoelectric element.

7. The micromirror device according to claim 1, wherein the resonance frequency A is equal to or greater than 10 kHz.

* * * * *